United States Patent
Tapalian et al.

(10) Patent No.: US 7,566,582 B2
(45) Date of Patent: Jul. 28, 2009

(54) SYSTEMS, METHODS AND DEVICES RELATING TO ACTUATABLY MOVEABLE MACHINES

(75) Inventors: H. Charles Tapalian, Seekonk, MA (US); Jason E. Langseth, Malden, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 578 days.

(21) Appl. No.: 11/258,688

(22) Filed: Oct. 25, 2005

(65) Prior Publication Data

US 2007/0090483 A1  Apr. 26, 2007

(51) Int. Cl.
*H01L 21/00* (2006.01)
(52) U.S. Cl. .................. 438/53; 438/50; 257/415; 257/E21.002
(58) Field of Classification Search ............... 438/50, 438/53; 257/415
See application file for complete search history.

(56) References Cited

U.S. PATENT DOCUMENTS

| | | | |
|---|---|---|---|
| 3,963,881 A | 6/1976 | Fraim et al. | |
| 4,585,209 A | 4/1986 | Aine et al. | |
| 4,910,840 A | 3/1990 | Sprenkels et al. | |
| 5,146,435 A | 9/1992 | Bernstein | |
| 5,216,490 A | 6/1993 | Greiff et al. | |
| 5,335,210 A | 8/1994 | Bernstein | |
| 5,452,268 A | 9/1995 | Bernstein | |
| 5,452,878 A | 9/1995 | Gravesen et al. | |
| 5,677,823 A | 10/1997 | Smith | |
| 5,684,324 A | 11/1997 | Bernstein | |
| 6,107,001 A | 8/2000 | Lewis et al. | |
| 6,215,644 B1 | 4/2001 | Dhuler | |
| 6,222,304 B1 | 4/2001 | Bernstein | |
| 6,225,190 B1* | 5/2001 | Bruel et al. | 438/458 |
| 6,341,039 B1 | 1/2002 | Flanders et al. | |
| 6,373,632 B1 | 4/2002 | Flanders | |
| 6,525,880 B2 | 2/2003 | Flanders et al. | |
| 6,768,412 B2 | 7/2004 | Becka et al. | |
| 6,806,593 B2 | 10/2004 | Tai et al. | |
| 6,821,797 B2 | 11/2004 | Machida et al. | |
| 6,829,132 B2 | 12/2004 | Martin et al. | |
| 6,836,366 B1 | 12/2004 | Flanders et al. | |
| 6,856,499 B2 | 2/2005 | Stokes | |
| 6,870,938 B2 | 3/2005 | Takeuchi et al. | |
| 6,878,567 B2* | 4/2005 | Winer et al. | 438/53 |
| 7,116,463 B2 | 10/2006 | Wu et al. | |
| 7,419,915 B2* | 9/2008 | Abraham et al. | 438/743 |
| 7,435,614 B2* | 10/2008 | Bruel | 438/53 |
| 2002/0027064 A1 | 3/2002 | York et al. | |
| 2002/0149294 A1 | 10/2002 | Matsumoto et al. | |

(Continued)

FOREIGN PATENT DOCUMENTS

EP  0 592 469 B1  5/1997

OTHER PUBLICATIONS

"Polymer," Wikipedia. Mar. 24, 2004.

(Continued)

*Primary Examiner*—Thao X Le
*Assistant Examiner*—Christy L Novacek
(74) *Attorney, Agent, or Firm*—Ropes & Gray LLP

(57) ABSTRACT

Systems, methods and devices relating to actuatably movable machines and with methods of using and manufacturing the same.

14 Claims, 34 Drawing Sheets

U.S. PATENT DOCUMENTS

| | | |
|---|---|---|
| 2004/0032185 A1 | 2/2004 | Kato |
| 2004/0058469 A1 | 3/2004 | Kowarz |
| 2005/0123243 A1 | 6/2005 | Steckl et al. |
| 2005/0231790 A1 | 10/2005 | Miles et al. |
| 2005/0243402 A1 | 11/2005 | Yun |
| 2006/0067651 A1 | 3/2006 | Chui |
| 2006/0168788 A1 | 8/2006 | Tilmans et al. |
| 2006/0181712 A1 | 8/2006 | Degertekin et al. |

OTHER PUBLICATIONS

Scheeper, P.R., et al., "A review of silicon microphones" Sensors and Actuators A44, pp. 1-11 (1994).

Scheeper, P.R., et al., "A Silicon Condenser Microphone: Materials and Technology" pp. 9-204.

* cited by examiner

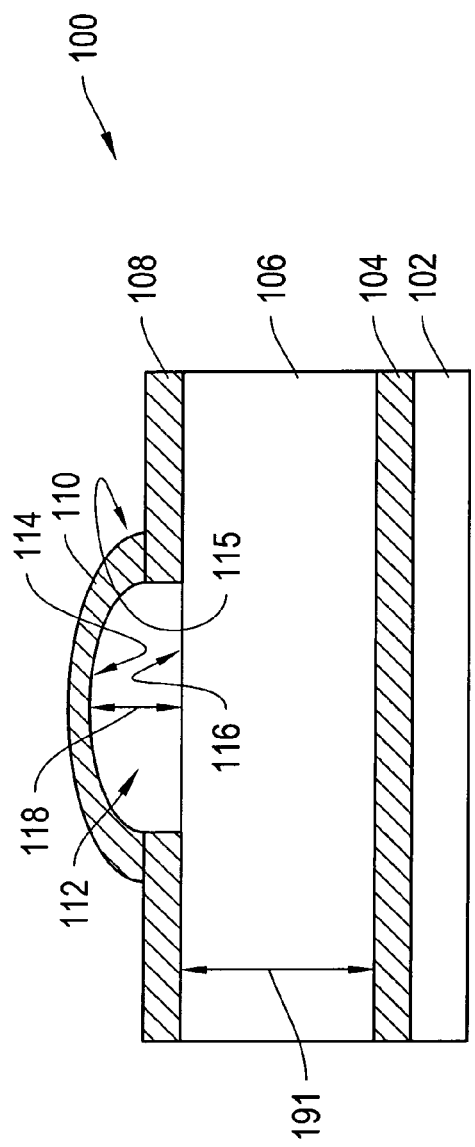
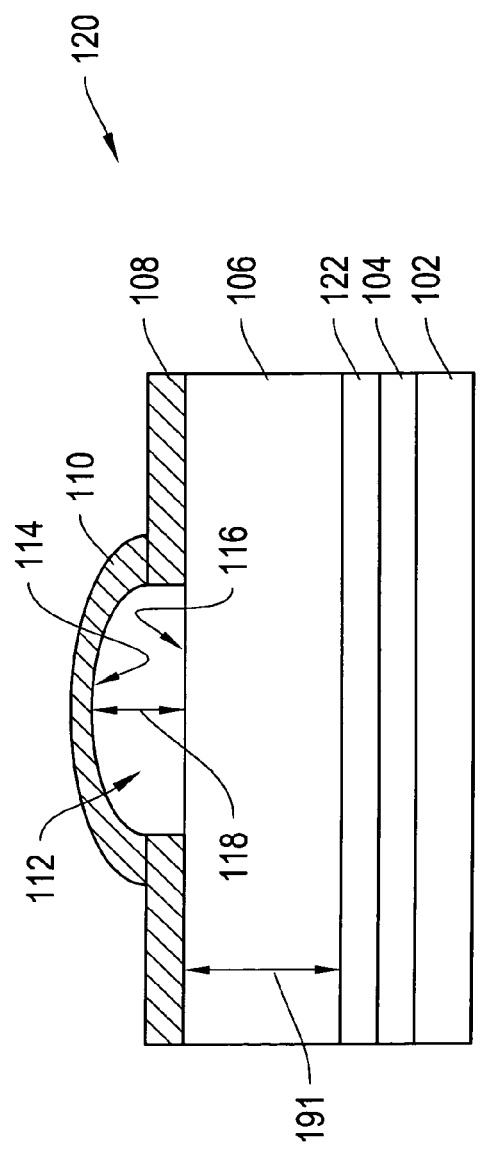

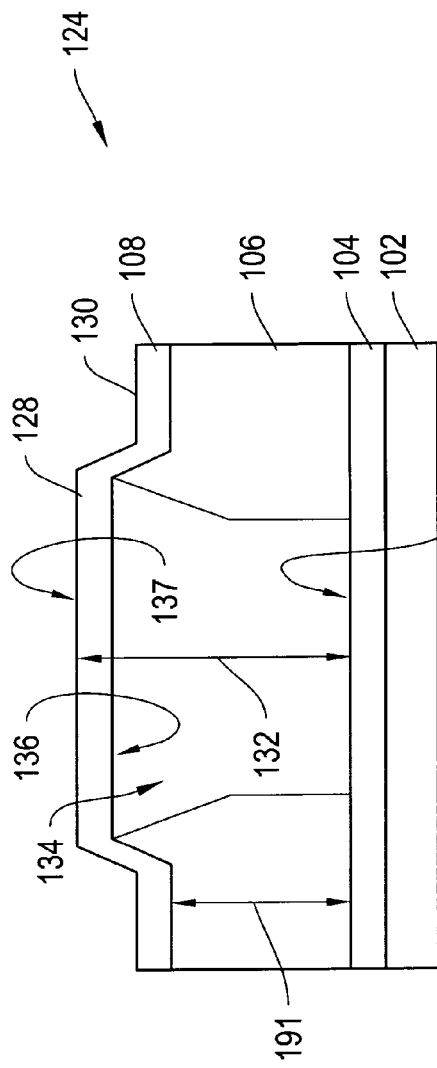
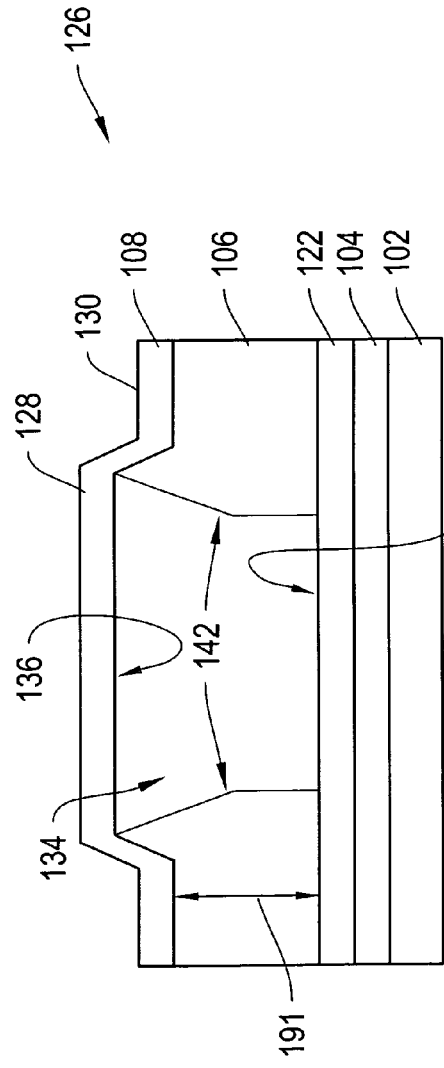

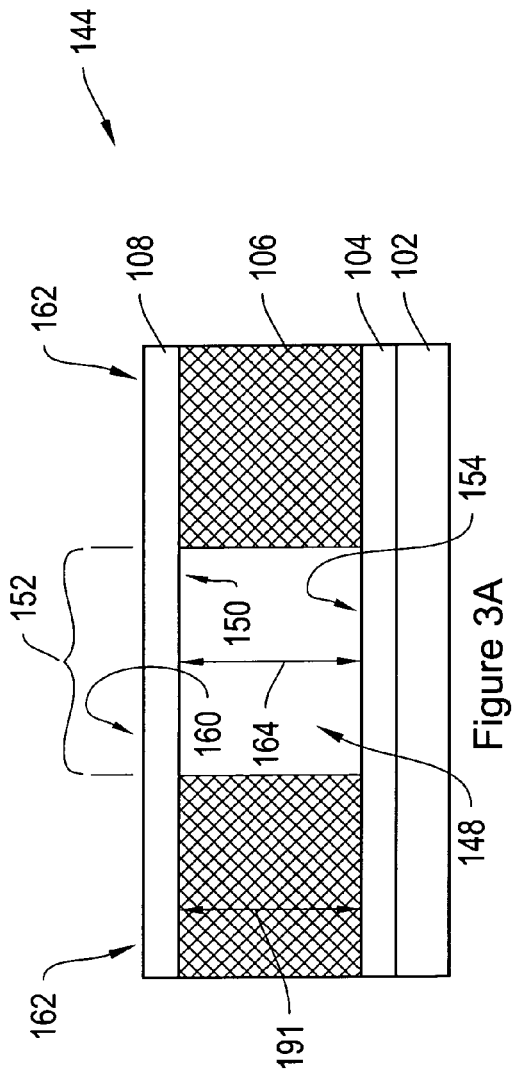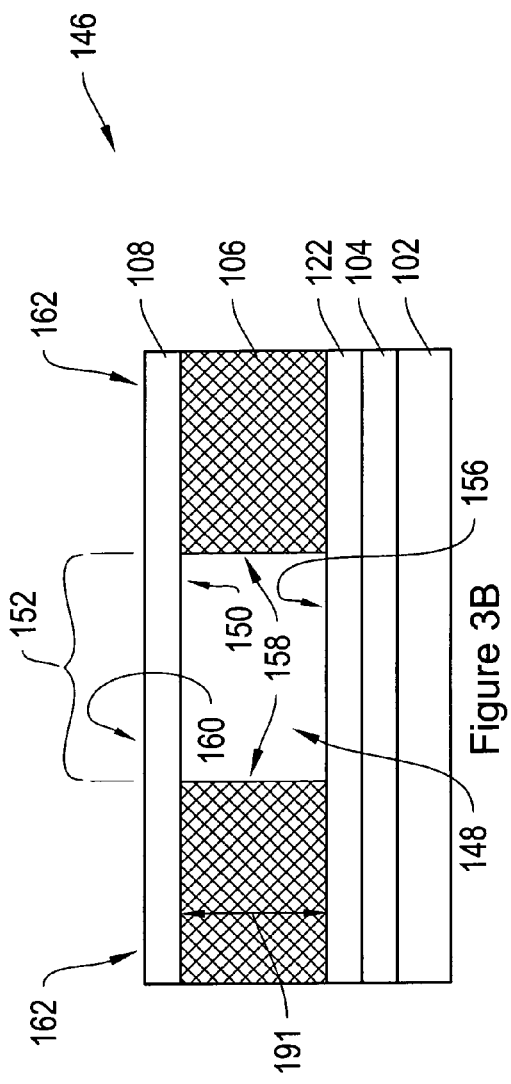

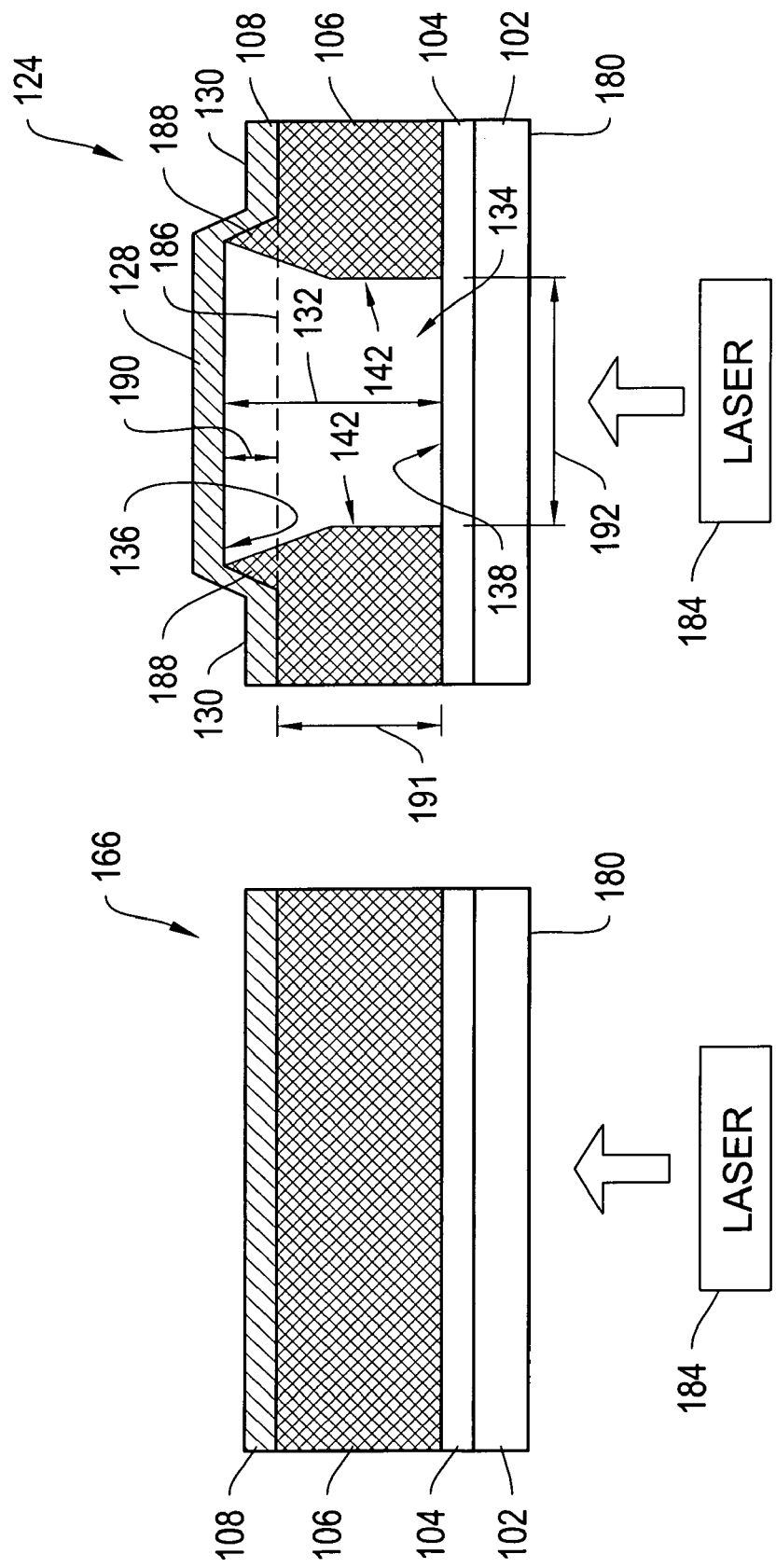

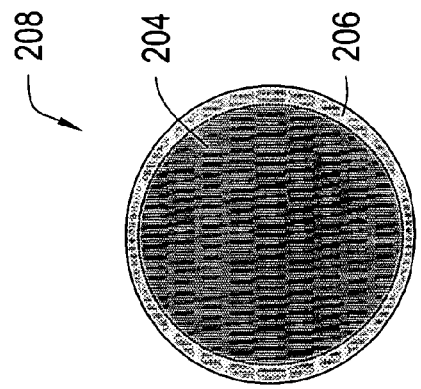
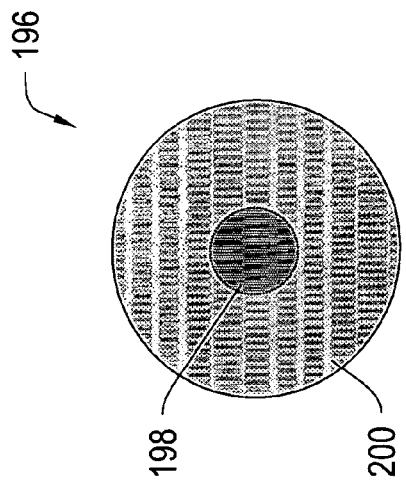
Figure 6A
Figure 6B
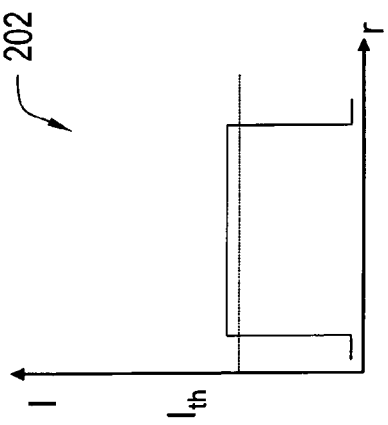
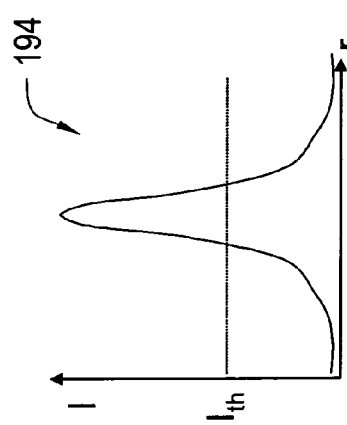
Figure 7A
Figure 7B

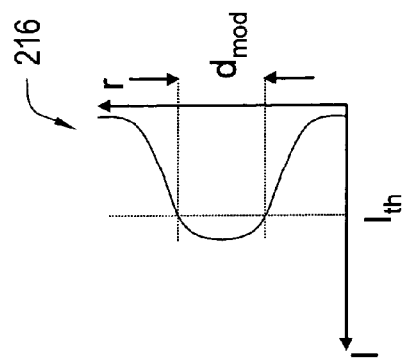
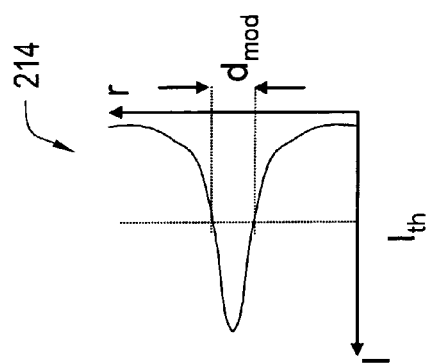
Figure 8
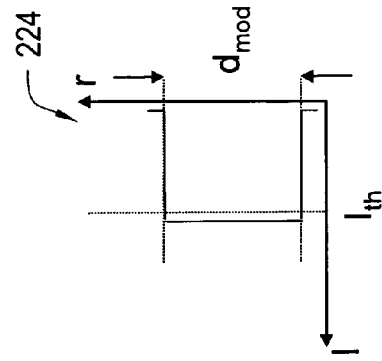
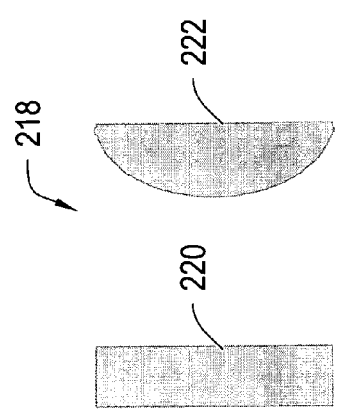
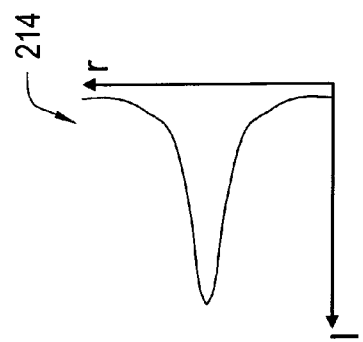
Figure 9

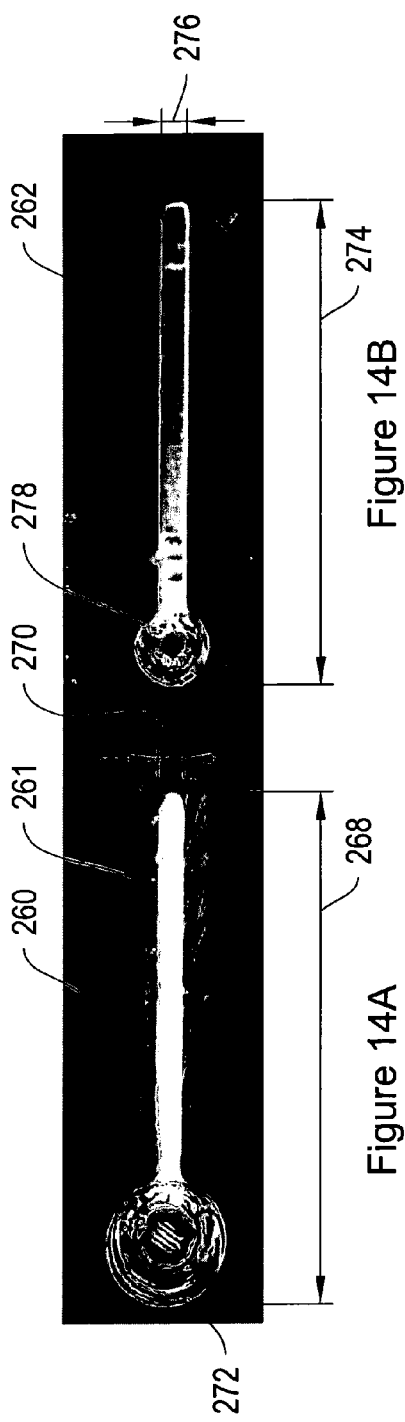
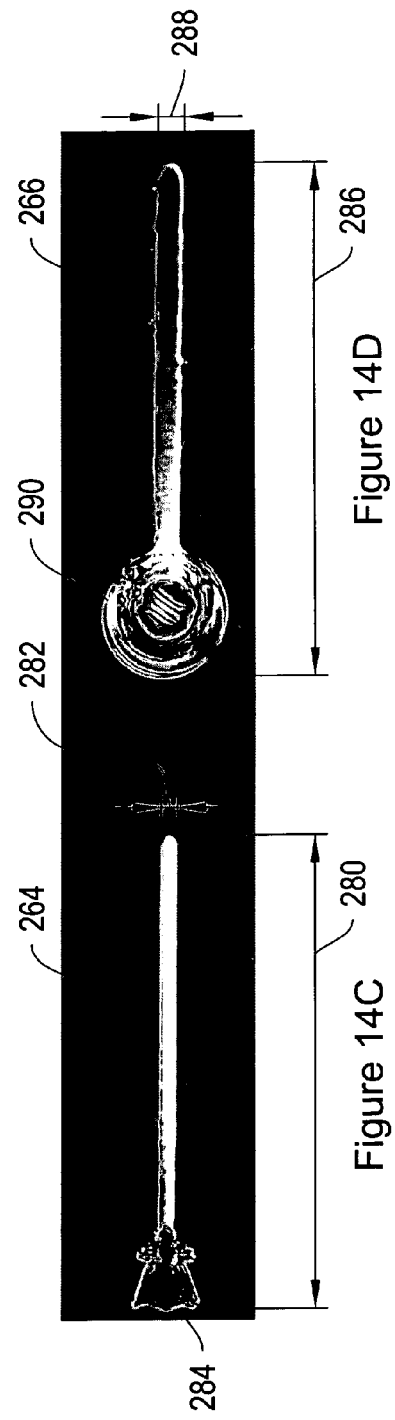
Figure 14A  Figure 14B  Figure 14C  Figure 14D

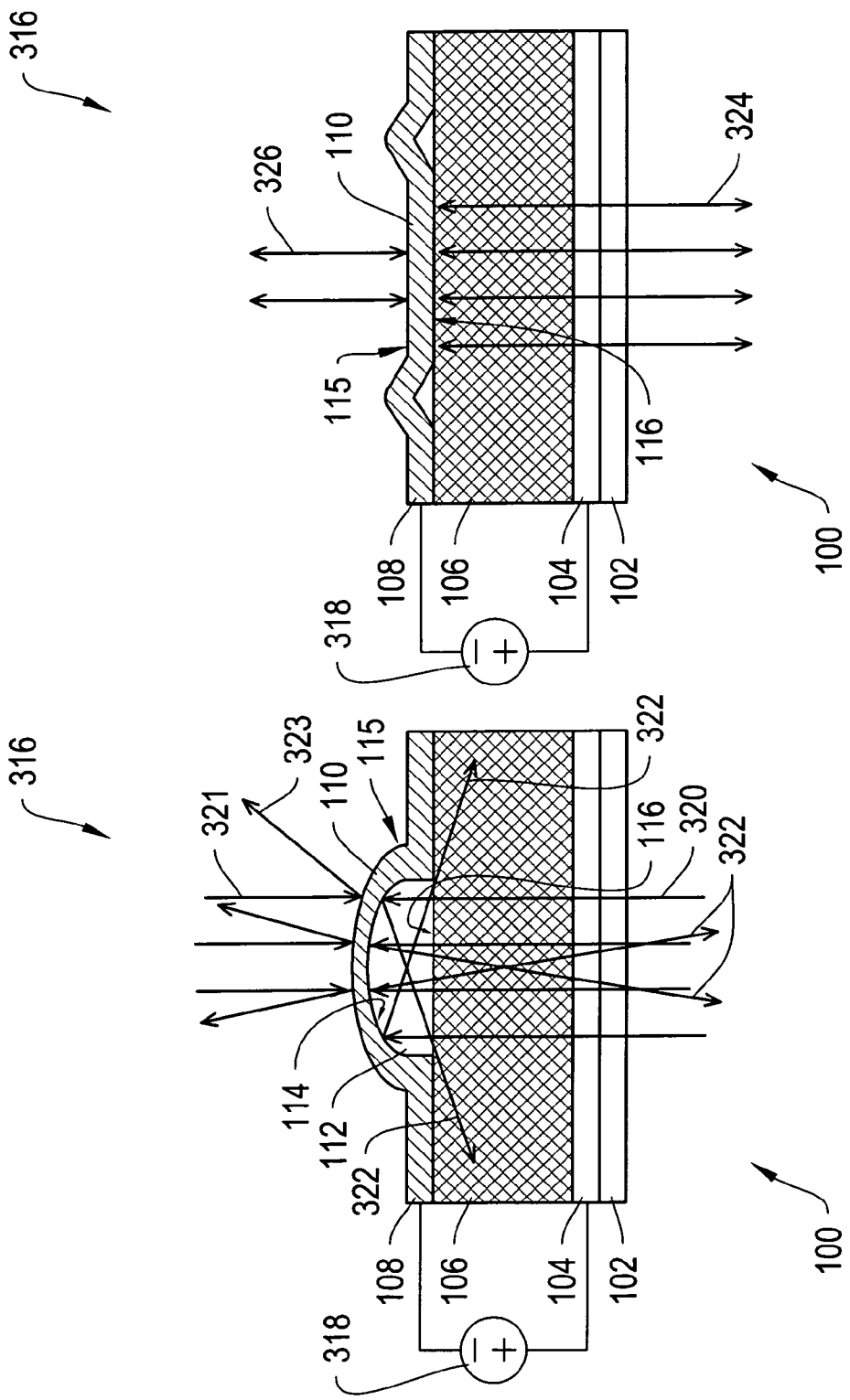

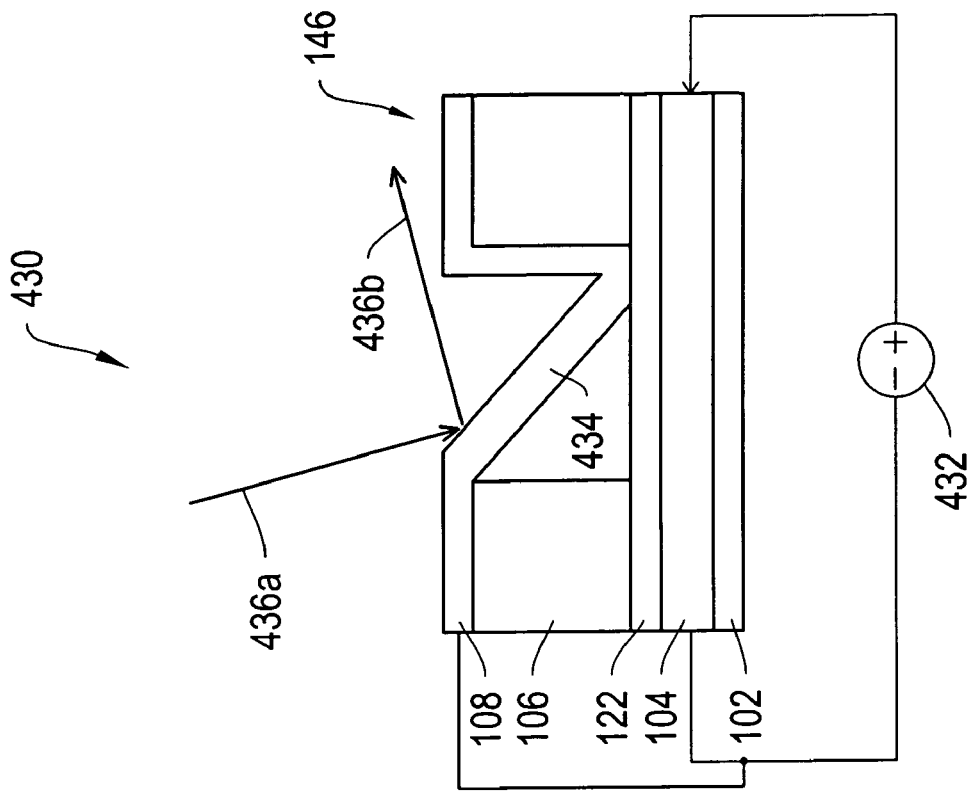
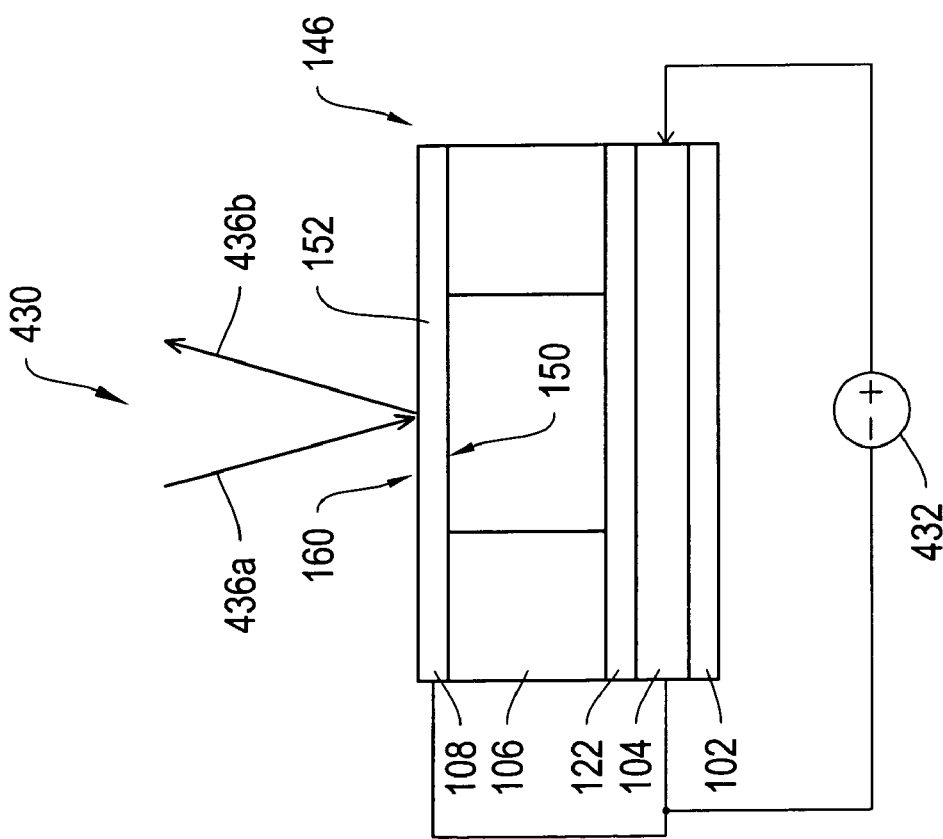

SYSTEMS, METHODS AND DEVICES RELATING TO ACTUATABLY MOVEABLE MACHINES

FIELD OF THE INVENTION

The invention, in various embodiments, is directed to systems, methods and devices relating to actuatable structures. In some implementations, the invention relates to miniature actuatable structures.

BACKGROUND OF THE INVENTION

Actuatable structures, including miniature actuatable structures, are generally known in the art. In typical implementations, in the case of miniature structures, the structures are electrostatically actuated. According to one conventional configuration, an actuatable structure includes a stationary electrode and a movable member suspended at a distance from the stationary electrode. In some instances the movable member acts as a second electrode. Applying a drive voltage across the movable and stationary electrodes generates an electrical field between them. Electrostatic forces created by the field cause the movable member to deflect toward the stationary electrode. Varying the drive voltage varies the magnitude of the deflection.

One drawback of actuatable structures of this type is that they can suffer from a lack of linearity between the drive voltage and the resulting displacement of the movable member. This makes it difficult to control displacement. Another drawback is that they typically have characteristic instabilities. These instabilities can cause the movable member to be suddenly pulled into contact with the stationary electrode when the drive voltage exceeds a particular limit. Both the nonlinearities and instabilities tend to reduce the range of controllable, and thus usable, displacement of the movable member.

In another conventional approach, a first electrical conductor is formed on a carrier. A second electrical conductor having an electrically insulating lining is also formed on the carrier as a diaphragm over the first electrical conductor. A hollow space is created between the insulating lining and the first electrical conductor. The drive voltage is applied between the first and second electrical conductors to electrostatically deflect the diaphragm, and thus the insulating lining, toward the second electrical conductor. In the event that the first electrical conductor is deflected sufficiently to eliminate the hollow space, a gas is fed into the structure to deflect the first electrical conductor and insulating layer back to its original position. In other examples, gas is fed into the hollow space to prevent the hollow space from being eliminated.

A significant drawback of this approach is that the use of an injected gas complicates the design and makes it considerably more expensive. Another drawback is the insulator located on the inside of the diaphragm. Repeated movement of the diaphragm can cause the insulating material to crack and/or separate from the first electrical conductor. Differences between thermal coefficients of the insulating material and the first conductor may also cause the insulator to crack and/or separate from the first conductor. Any failure of the insulating layer can lead to a short between first and second conductors, and thus device.

A disadvantage of both prior art approaches discussed above is that they are formed by conventional techniques, such as masking, photolithography, chemical etching and/or reactive ion etching. All of these processes limit the types of materials that may be used, the types of mechanical structures that may be formed, and also the size of the mechanical structures that may be formed.

Accordingly, there is a need for both improved actuatable structures and methodologies for making them.

SUMMARY OF THE INVENTION

The invention addresses the deficiencies in the prior art by, in various embodiments, providing improved systems, methods and devices relating to actuatably movable/deflectable machines in general, and more particularly to miniature actuatably movable/deflectable machines. By deflectable or movable, it is meant that an actuatable region (e.g., a diaphragm or membrane) can displace from a rest position to at least a second position, and optionally, can return back to the rest position. By actuatably or actuatable, it is meant that such displacement may be accomplished in a controlled fashion (e.g., under control of a processor, control signal, operator or the like). One improvement of the machines of the invention is that they can be directly written into a substrate by a laser. Using the laser direct write techniques of the invention, the machines may be written in any arbitrary pattern, individually or in an array, and of any arbitrary size and shape. Such arbitrary patterns, shapes and sizes are not available using conventional laser, etching, or deposition techniques. Another improvement is that the direct write laser techniques enable machines having enclosed chambers to be easily formed on substrates.

It is to be noted that the size ranges provided herein are provided for illustrative purposes only, and that one advantage of the approaches of the invention is that devices of a wide range of sizes may be formed, for example, by proportionately enlarging the dimensions of the illustrative actuatable machines, by fabricating overlapping structures to effectively create a larger structure, and/or by aggregating the illustrative machines into arrays. By way of example, the various dimensions of the machines of the invention may be proportionately scaled to form macrostructures having dimensions in the millimeter, centimeter, decimeter, meter or larger range. It is noted that such machines may be constructed with lasers having increased power and larger beam sizes, and may employ different materials than those described herein. Additionally, similarly sized and even larger structures may be formed by aggregating arrays of the machines of the invention, or forming overlapping structures.

The combination of being able to be written in any arbitrary size, shape, and pattern, with actuatably deflectable/movable membranes/diaphragms, and optionally, including enclosed chambers, enable the machines of the invention to be used in a wide range of applications, such as and without limitation, in tunable mirrors, tunable optical filters, tunable light modulators, optical beam steering systems, information modulation systems, optical beam switching and routing devices, laboratory optical phase modulation equipment, object identification systems, image projection systems, optical sensors, optical displays, and signage.

According to some applications, the chambers of the invention may be filled with a substance, such as a therapeutic agent, for controlled delivery. According to one implementation, each of the chambers of an array of machines may be individually addressed to release the substance. In other applications, the chambers include inlets and outlets and may be employed as microchannels through which effluents may flow. In a related application, diaphragms/membranes of the machines may be actuated to create a pumping action to pump effluent through microchannels in a controlled fashion.

According to one aspect, an actuatably movable machine of the invention includes a substrate, a first conductor disposed on the substrate, a thin film disposed on the first conductor, a second conductor disposed on the thin film and a chamber. According to one embodiment, the second conductor includes a dome shaped actuatable region, which directly forms a first section of a periphery of the chamber. According to one configuration, the chamber is bounded along a second section of the periphery by the thin film. The height of the chamber defines the maximum amount by which the actuatable region may be deflected.

According to various implementations having a dome shaped actuatable region, the chamber has a height at an apex of at least about 1 micrometer ($\mu m$), at least about 2.5 $\mu m$, at least about 5.0 $\mu m$, at least about 7.5 $\mu m$, or at least about 10 $\mu m$. According to other configurations, the side of the chamber opposite the dome shaped actuatable region has a substantially ovular shape with a maximum diameter of between about 1 $\mu m$ and about 500 $\mu m$. In particular configurations, the diameter is between about 1 $\mu m$ and about 5 $\mu m$, between about 5 $\mu m$ and about 10 $\mu m$, between about 10 $\mu m$ and about 50 $\mu m$, between about 50 $\mu m$ and about 100 $\mu m$, between about 100 $\mu m$ and about 200 $\mu m$, between about 200 $\mu m$ and about 300 $\mu m$, or between about 300 $\mu m$ and about 400 $\mu m$. In an alternative embodiment, the actuatable region of the second conductor is substantially flat, and at least a portion of the thin film located below the actuatable region is displaced and/or removed to form the chamber between the actuatable region of the second conductor and the first conductor. According to one feature of this embodiment, the side wall(s) of the chamber are formed by the remaining thin film. According to some configurations, a section of the periphery of the chamber is formed directly by the first conductor. However, in other configurations, an electrical insulator is disposed between the thin film and the first conductor to help ensure that an electrical short circuit does not occur between the first and second conductors. In such configurations, a section of the periphery of the chamber is formed directly by the electrical insulator rather than by the first conductor.

In some embodiments, the actuatable region of the second conductor lies substantially in the same plane as a surrounding region of the second conductor and is visually substantially indistinguishable from the surrounding region of the second conductor when in an unactuated state. According to one feature of such embodiments, the height of the chamber is determined by the thickness of the thin film. In some configurations, the thickness of the thin film, and thus the height of the chamber and the amount by which the actuatable region may be deflected, is between about 50 nm and about 1 $\mu m$. In other configurations, the thin film has a thickness of less than about 50 nm, between about 50 nm and about 100 nm, between about 100 nm and about 150 nm, between about 150 nm and about 200 nm, between about 200 nm and about 250 nm, between about 250 nm and about 300 nm, between about 300 nm and about 350 nm, between about 350 nm and about 400 nm, between about 450 nm, and about 500 nm, and about 500 nm and about 1 $\mu m$. In some configurations, the thickness of the thin film, and thus the amount by which the actuatable region may be deflected is less than about 50 nm. One advantage of the coplanar configuration is that actuatable region of the second conductor remains hidden until deflected.

In other embodiments, the actuatable region of the second conductor is raised with respect to the surrounding region of the second conductor. One advantage of raising the actuatable region relative to the surrounding region of the second conductor is that it increases the height of the chamber and thus provides an increased range of actuatable region deflection (e.g., the entire height of the chamber wall). According to various configurations of these embodiments, the height of the chamber, and thus the amount by which the actuatable region may be deflected, is at least about 1 $\mu m$, at least about 2.5 $\mu m$, at least about 5.0 $\mu m$, at least about 7.5 $\mu m$, or at least about 10 $\mu m$.

As mentioned above, in the case of the machines having dome shaped actuatable regions, the chamber may have a substantially ovular bottom (e.g., the side of the chamber opposite to the actuatable regions) geometry, which in some configurations may be circular. Similarly, in the case of the machines having a substantially flat actuatable region, the bottom of the chamber may also be ovular or circular and may have similar dimensions to those having a dome shaped actuatable region. However, in other configurations, the chamber may have any arbitrary foot print. For example, the bottom of the chamber may be polygonal, rectangular, triangular, star shaped, zigzag shaped or the like. In addition, the chamber bottom may include straight section and/or curved sections. In one configuration, the bottom of the chamber is conduit shaped having a width of less than about 100 micrometers and a length of between about 1 millimeter and about 3 millimeters. In some configurations, the length may be greater than 3 millimeters. In other configurations, the width may be less than about 50 micrometers, or less than about 25 micrometers.

Any suitable materials may be employed for the various components of the machines of the invention. By way of example, the substrate may be formed from any suitable light transmissive material, including any suitable flexible light transmissive material. In some implementations, the substrate is formed from a silica glass, while in other implementations, it is formed from a flexible or rigid polymer plastic.

The first conductor is preferably formed from a light transmissive material, at least along a portion aligned with the actuatable region of the second conductor. According to some implementations, the first conductor is formed from a transparent conductive oxide, such as without limitation, indium-tin-oxide (ITO) or aluminum-doped zinc oxide. According to one implementation, the first conductor is formed as a layer on top of the substrate and has a thickness of between about 50 nm and about 300 nm thick. In other implementations, the thickness of the first conductor is less than about 50 nm, between about 50 nm and about 100 nm, between about 100 nm and about 150 nm, between about 150 nm and about 200 nm, between about 200 nm and about 250 nm, or between about 250 nm and about 300 nm.

According to some embodiments, the material for the first conductive layer is selected for reduced electrical conductivity so as to be capable of supporting a potential difference across a region aligned with the actuatable region of the second conductor. As discussed below in further detail, such a feature enables the actuatable region to be deflected at an angle, for example, for optical beam steering and image projection applications. The electrical insulator, when employed, is also preferably formed from a light transmissive material, such as silicon oxide ($SiO_2$) or aluminum oxide ($Al_2O_3$), or any other suitable material. According to one implementation, the electrical insulator is formed as a layer on top of the first conductor, at least in a region aligned with the actuatable region of the second conductor, and has a thickness of between about 10 nm and about 100 nm.

The thin film, in some configurations, is an organic thin film formed from an aromatic macrocycle, such as copper phthalocyanine (CuPC), while in other configurations, an amine-based organic die, such as tris-[dibutylphenyl (amine)]+:SbF6 (IR-99), is used. According to one implementation, an aromatic macrocycle capable of absorbing light in a range of between about 800 nm to about 1200 nm is used. In another implementation, a free-radical organic salt capable of absorbing light in a range of between about 400 nm to about 800 nm is used. In other configurations, the thin film is formed from any other suitable material, such as suitable polymer materials. Suitable materials are, for example, those materials that may be ablated at laser intensities low enough not to damage the surrounding layers. According to one implementation, the thin film is formed as a layer on top of the first conductor, while in other implementations, it is formed as a layer on top of the electrical insulator.

The second conductor may or may not be optically transparent. In some configurations, the second conductor is formed from aluminum (Al) and is reflective on both inner and outer surfaces, enabling light incident on both outer and inner surfaces of the actuatable region to be reflected. In other implementations, the second conductor is formed, at least along the actuatable region, from a light transmissive material, enabling the machine to act as an tunable optical filter, with tuning being accomplished by deflecting the actuatable region to change the distance between the first and second conductors and thus, the height of the chamber.

According to some implementations, the second conductor is formed from a transparent conductive oxide, such as without limitation, indium-tin-oxide (ITO) or aluminum-doped zinc oxide. According to one implementation, the second conductor is formed as a layer on top of the thin film and has a thickness of between about 50 nm and about 300 nm thick. In other implementations, and depending on the desired level of conductivity and the desired size of the machine being formed, the thickness of the second conductor is less than about 50 nm, between about 50 nm and about 100 nm, between about 100 nm and about 150 nm, between about 150 nm and about 200 nm, between about 200 nm and about 250 nm, between about 250 nm and about 300 nm, or greater than about 300 nm.

According to another aspect, the invention is directed to various methodologies for fabricating three dimensional structures in general, and actuatably movable (optionally, miniature) machines specifically. According to one embodiment, the method of the invention includes employing a structure including a first conductor located on a substrate, an thin film located on the conductor, and a second conductor located on the thin film. It should be noted that any of the above described variations relating to the structure of the machines of the invention may also be employed with any of the below described fabrication approaches.

According to one methodology, the machines of the invention may be formed by heating the structure to cause sections of the second conductor to blister up or delaminate from the organic thin film to form the above described chambers and dome shaped actuatable regions in the second conductor. According to one implementation, the structure is placed in an oven and heated to a temperature sufficient to cause the dome shaped actuatable regions to form.

However, in alternative embodiments, the heating is performed by exposing a bottom side of the substrate to at least one laser light spot at a location aligned with a location on the second conductor at which the machine is to be formed. The wavelength of the laser and the time for which the bottom side of the substrate is exposed to the laser is dependent on the materials used for and the thicknesses of the thin film and second conductor layers. The laser parameters are also dependent on the size of the machine being fabricated. According to a preferred embodiment, the wavelength of the laser is within the absorption band of the thin film material. In one implementation, the bottom of the substrate is exposed to the laser for less than about 3 seconds at each location where a machine is to be formed. According to a further implementation, the laser is collimated into a spot having a diameter of between about 10 micrometers and about 300 micrometers, and provides at least about 300 milliwatts of power to each location on the bottom of the substrate.

According to another embodiment, the chambers may be formed by flowing sufficient current through the thin film to cause sections of the second conductor to blister up or delaminate from the thin film. The magnitude of the current, along with the duration of time for which it is applied are dependent on the electrical conductivity of the thin film, which is in turn dependent on the material and the thickness of the thin film. The magnitude of the current and the duration of time for which it is applied is also dependent on the material, thickness, and surface area of the second conductor.

According to some embodiments, the structure may include a layer, such as a thermally and/or electrically insulating layer, for example, between the thin film and the first conductor or between the thin film and the second conductor. According to one feature, the insulating layer is patterned with through apertures. The through apertures facilitate formation of the dome shaped actuatable regions in the second conductor at aperture locations, while the remainder of the insulating layer shields the second conductor from the applied heat and thus inhibits formation of the dome shaped actuatable regions.

According to another aspect, the fabrication methods of the invention include direct laser writing the machines into a structure including a first conductor located on a substrate, a thin film on the conductor, and a second conductor on the thin film. According to one embodiment, the method includes applying a focused laser to the thin film layer through the substrate and the first conductive layer to create at least one enclosed chamber in the thin film layer to form at least one actuatably movable machine. As described above, at least one actuatably movable machine includes the enclosed chamber, and the enclosed chamber is bounded along a first section of its periphery directly by the actuatable region of the first conductor, and along a second section of its periphery by the thin film layer (e.g., the walls and/or bottom of the chamber being formed by the thin film).

According to one implementation, the focused laser is a pulsed laser. Each laser pulse may have a pulse width, for example, of less than about 250 fsec, 200 fsec or 100 fsec. The laser may also apply a maximum energy of less than or equal to about 50 nano-Joules/pulse, less than or equal to about 40 nano-Joules/pulse, or less than or equal to about 30 nano-Joules/pulse. In other implementations, the laser may employ pulses on the order of picoseconds or nanoseconds. Additionally, the energy applied may be on the order of microjoules, for example, depending on the pulse width, repetition rate, and wavelength of the laser. As with other parameters discussed herein, the particular parameters employed for fabricating the structures of the invention are dependant, for example, on the materials used and the desired dimensions of the machine being fabricated.

According to one embodiment, the focused laser collimates to a spot having a diameter about equal to a diameter/width of the chamber. However, this need not be the case, since the laser can be used to direct write any pattern into the thin film, and thus form a chamber having any desired shape. According to various embodiments, the diameter of the laser spot is less than or equal to about 300 micrometers, less than or equal to about 250 micrometers, less than or equal to about 200 micrometers, less than or equal to about 150 micrometers, less than or equal to about 100 micrometers, or less than or equal to about 50 micrometers. According to one feature, the wavelength of the laser is selected so that the laser light can pass through the substrate and the first conductor to interact with the thin film. According to alternative embodiments, the laser spot may be collimated to a diameter of greater than 300 micrometers, and may be collimated to a spot on the order of millimeters, centimeters, decimeters or larger. As the spot diameter increases, laser power is increased to provide the required intensity, with spot size being limited, at least in part, by practical stability requirements of the fabricated structures.

In other aspects, the invention is directed to methods of operating the actuatably movable machines of the invention. By way of example, a control voltage may be applied across the first and second conductors to cause the actuatable region to deflect toward the substrate. In the case of a dome-shaped actuatable region, in an unactuated state, light incident on either an inner or outer side of the actuatable region is scattered due to the convex (outer side) or concave (inner side) shape of the surface of the actuatable region. However, in response to a control voltage, the actuatable region of the first conductor deflects inward toward the thin film. In a fully actuated state, the actuatable region is substantially flat or at least includes a substantially flat section large enough to reflect light incident on either an inner or outer side. According to one feature, varying control voltage levels may be applied across the first and second conductors to achieve varying degrees of deflection of the actuatable region toward the thin film. According to another feature, in intermediate states of actuation (e.g., having a sufficient control voltage applied to cause the actuatable region to deflect toward, but not contact with the thin film), the actuatable region (including a dome-shaped actuatable region) includes substantially flat sections suitable for reflecting light with reduced scattering.

According to one application, the control voltage is an AC voltage, having a frequency of between about 10 kHz and about 100 MHz and an amplitude sweeping from 0 $V_{peak}$ to about 10 $V_{peak}$. According to one application, such a configuration may be used as an optical phase modulator. In one particular configuration, the frequency of the AC control voltage may be operator adjusted to provide operator selectable phase modulation of a reflected component of an optical signal incident on the actuatable region. In a further configuration, the operator adjustable phase modulator is provided as a compact unit for laboratory use According to one configuration, the actuatable region of the second conductor has a non-resonant actuation bandwidth of at least about 100 MHz. According to another configuration, the actuatable region of the second conductor has a non-resonant actuation bandwidth of between about 10 kHz and about 100 MHz.

According to another application, the control voltage may be varied to modulate information onto a reflected component of an optical signal incident on the actuatable region. According to a further application, the control voltage may be varied to change the distance between the first and second conductors inside the chamber to provide a tunable optical filter, such as a Fabry-Perot optical filter.

In other applications, a plurality of machines of the invention are arranged in an array. In one implementation, each of the machines are individually controllable. According to one feature of this implementation, a differing AC or DC control voltage may be applied to each of the machines of the array to form a beam steering array, with each element of the array providing for a different optical phase shift. According to another feature, the control voltages may be varied to adjust beam steering characteristics.

In another implementation, each of the chambers of the array contain a substance, such as a therapeutic agent. According to one feature, a sufficient control voltage can be applied to any of the machines of the array to deflect a respective actuatable region to a degree that it breaks to release the substance contained in the chamber. In another application the control voltage may be provided by a sensor signal, and the actuatable region may be optically interrogated, from either an external or internal surface, to collect information from the sensor.

According to another application, the one or more machines of the invention having actuatable regions that are substantially coplanar with a surrounding portion of the second conductor may be direct written, for example, with a laser in any arbitrary pattern. According to one feature, a non-zero control voltage may be applied between the first and second conductors to deflect the actuatable region(s) to reveal the pattern.

In a further application, the first conductor is selected or configured to have a reduced electrical conductivity and a control voltage is provided across it. By varying the control voltage across the first conductor, the actuatable region may be made to deflect at correspondingly varying angles. Such an implementation may be used, for example, for optical beam steering, in an optical projection system, for example, where no deflection denotes an "on" pixel and angled deflection denotes an "off" pixel, or in an optical switch/router.

Additional applications, features and advantages of the invention will be apparent from the below described illustrative embodiments with reference to the appended drawings.

BRIEF DESCRIPTION OF THE DRAWINGS

The appended drawings depict illustrative embodiments of the invention in which like reference numerals refer to like elements. These depicted embodiments may not be drawn to scale and are to be understood as illustrative of the invention and not as exhaustive or limiting in any way.

FIG. 1A depicts a cross-sectional view of a actuatably movable machine including a dome-shaped deflectable region according to an illustrative embodiment of the invention.

FIG. 1B depicts a cross-sectional view of a actuatably movable machine similar to that of FIG. 1A, but including an electrically insulative layer, according to a further illustrative embodiment of the invention.

FIG. 2A depicts a cross-sectional view of a actuatably movable machine including a raised deflectable diaphragm according to another illustrative embodiment of the invention.

FIG. 2B depicts a cross-sectional view of a actuatably movable machine similar to that of FIG. 2A, but including an electrically insulative layer, according to a further illustrative embodiment of the invention.

FIG. 3A depicts a cross-sectional view of a actuatably movable machine including a deflectable diaphragm located in a conductive layer, the diaphragm lying substantially in the plane of the conductive layer when not deflected, according to another illustrative embodiment of the invention.

FIG. 3B depicts a cross-sectional view of a actuatably movable machine similar to that of FIG. 3A, but including an electrically insulative layer, according to a further illustrative embodiment of the invention.

FIGS. 5A and 5B conceptually depict an illustrative way of fabricating the actuatably movable machines of FIGS. 2A-3B.

FIGS. 6A and 6B illustrate characteristics of a actuatably movable machine of the type depicted in FIGS. 2A-3B resulting from application of a laser having a Gaussian profile.

FIGS. 7A and 7B illustrate characteristics of a actuatably movable machine of the type depicted in FIGS. 2A-3B resulting from application of a laser having a substantially rectangular profile.

FIG. 8 depicts an optical configuration for transforming a laser having the Gaussian profile of FIG. 6A to have a profile more closely resembling the substantially rectangular profile of FIG. 7A according to an illustrative embodiment of the invention.

FIG. 9 depicts another optical configuration, including a phase delay element, for further transforming the laser of FIG. 6A to have a profile matching the substantially rectangular profile of FIG. 7A according to another illustrative embodiment of the invention.

FIGS. 14A-14D show illustrative elongated actuatably movable machines of the type depicted in FIG. 3A having differing dimensions and formed using processes of the invention.

FIGS. 16A and 16B conceptually depict operation of the actuatably movable machine of FIG. 1A.

FIGS. 31A and 31B are conceptual diagrams illustrating use of a actuatably movable machine in a pixel addressable imaging array.

DESCRIPTION OF THE ILLUSTRATIVE EMBODIMENTS

Figure 4A:
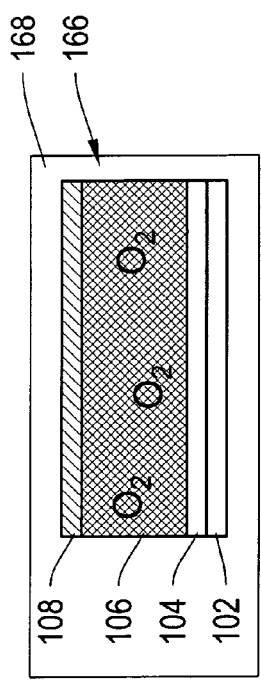
FIGS. 4A-4D conceptually depict various illustrative ways of fabricating the actuatably movable machines of FIGS. 1A and 1B.

As described above in summary, the invention provides, in various illustrative embodiments, improved systems, methods and devices relating to actuatably movable/deflectable machines. In some implementations, the machines may be miniature, for example, having dimensions on the order of centimeters, millimeters, micrometers, nanometers or smaller. However, as explained below in further detail, one advantage of the invention is that it also enables larger machines to be made. As explained above, by deflectable or movable, it is meant that an actuatable region (e.g., a diaphragm or membrane) can displace from a rest position to at least a second position, and optionally, can return back to the rest position. As also explained above, by actuatably or actuatable, it is meant that such displacement may be accomplished in a controlled fashion (e.g., under control of a processor, control signal, operator or the like). An important improvement of the machines of the invention is that they can be directly written into a substrate by a laser. Using the laser direct write techniques of the invention, the machines may be written in any arbitrary pattern, individually, in an array, or in an overlapping fashion. Such arbitrary patterns are not available using conventional laser, etching, or deposition techniques. Another important improvement is that the direct write laser techniques enable miniature machines having enclosed chambers to be easily formed on substrates. A further improvement is that the miniature machines of the invention do not suffer from lock in failures (i.e., where the actuatable region gets stuck in a fully actuated/deflected position and will not return to an unactuated rest state simply by removing the control signal that caused the deflection.).

The combination of being able to be written in any arbitrary shape, with actuatably deflectable/movable membranes/diaphragms, and optionally, including enclosed chambers, enable the machines of the invention to be used in a wide range of applications, such as and without limitation, in tunable mirrors, tunable optical filters, tunable light modulators, optical beam steering systems, information modulation systems, optical beam switching and routing devices, laboratory optical phase modulation equipment, object identification systems, image projection systems, image display systems, signage and optical sensors.

Illustrative embodiments of the miniature machines of the invention are described below, first with respect to their various structures. After that, illustrative methods of manufacturing the miniature machines of the invention are described, followed by methods of using the miniature machines. Lastly, we describe illustrative applications for the machines of the invention.

FIGS. 1A and 1B depict cross-sectional views of an actuatably movable machines 100 and 120, respectively, according to two illustrative embodiments of the invention. As shown, the machines 100 and 120 both include a substrate 102, a first conductor 104 disposed on the substrate 102, a thin film 106 (illustratively, an organic thin film) disposed on the first conductor 104, and a second conductor 108 disposed on the thin film 106. The second conductor 108 of both machines 100 and 120 includes a dome shaped actuatable region 110, an inner surface 114 of which directly forms a first section of a periphery of a chamber 112. The illustrative chamber 112 of both machines 110 and 120 is bounded along a second peripheral section by an inner surface 116 of the thin film 106. In the illustrative embodiment of FIG. 1B, the device 120 also includes an electrically and/or thermally insulator 122 disposed between the conductor 104 and the thin film 106. As described in further detail below, the layer 122 may be useful in forming domed chambers, such as the domed chamber 112.

According to the illustrative embodiment and as described below in further detail the dome shaped actuatable region 110 may be deflected by as much as the height 118 of the chamber 112, or by as small of an amount as is desirable for the particular application. In one illustrative embodiment, the chamber 112 has a height 118 at an apex of the actuatable region 110 of at least about 1 micrometer ($\mu m$). However, in other illustrative embodiments, the height 118 is at least about 2.5 $\mu m$, at least about 5.0 $\mu m$, at least about 7.5 $\mu m$, or at least about 10 $\mu m$, or higher. According to the illustrative embodiment of FIG. 1A, the side of the chamber opposite the dome shaped actuatable region 110 and bounded by the peripheral section 116 has a substantially round shape with a diameter of between about 1 $\mu m$ and about 500 $\mu m$. However, in other illustrative embodiments, the peripheral section 116 may be substantially ovular, or may be generally ovular or circular with peripheral irregularities, for example, such as ragged outline. According to various particular configurations, the maximum diameter/width of the peripheral section 116 is between about 1 $\mu m$ and about 5 $\mu m$, between about 5 $\mu m$ and about 10 $\mu m$, between about 10 $\mu m$ and about 50 $\mu m$, between about 50 $\mu m$ and about 100 $\mu m$, between about 100 $\mu m$ and about 200 $\mu m$, between about 200 $\mu m$ and about 300 $\mu m$, or between about 300 $\mu m$ and about 400 $\mu m$, greater than about 400 $\mu m$, greater than about 1 millimeter, greater than about 10 millimeters, greater than about 1 centimeter, or greater than about 1 decimeter. According to other particular configurations, the irregularities deviate from an ovular outline by less than about ±20% of the maximum diameter/width of the peripheral section 116.

FIGS. 2A and 2B depict cross-sectional views of actuatably movable machines 124 and 126, respectively, according to other illustrative embodiments of the invention. As in the illustrative embodiment of FIGS. 1A and 1B, the machines 124 both include a substrate 102, a first conductor 104 disposed on the substrate 102, an thin film 106 disposed on the first conductor 104, and a second conductor 108 disposed on the thin film 106. In a similar fashion to the illustrative embodiment of FIG. 1B, the machine 126 includes an electrical insulator 122 disposed between the first conductor 104 and the thin film 106.

As in the case of the machines 100 and 120, the machines 124 and 126 include a chamber 134. In the illustrative embodiment of FIG. 2A, the chamber 134 is directly bounded along a first peripheral section by an inner side 136 of the actuatable region 128 of the second conductor 108, and along a second peripheral section directly by an inner surface 138 of the first conductor 104. In the illustrative machine 126, the chamber 134 is bounded along the second peripheral section directly by an inner surface 140 of the insulator 122. According to this configuration, the electrical insulator 122 prohibits the first 104 and second 108 conductors from forming an electrical short circuit in the event that the actuatable region 128 is fully deflected toward the first conductor 104. The insulator 122 also inhibits the flow of DC current between the conductors, thus eliminating unwanted bubble formation resulting from device heating. As discussed in further detail below, according to one illustrative embodiment, the chamber 134 of FIGS. 2A and 2B is formed by displacing and/or removing at least a portion of the thin film 106 located below the actuatable region 128. According to one feature of this embodiment, the side wall(s) 142 of the chamber 134 is/are formed by the remaining thin film 106.

In contrast to the dome shaped actuatable region 110 of the machines 100 and 120, both of the machines 124 and 126 have a substantially flat actuatable region 128. According to the illustrative embodiments of FIGS. 2A and 2B, the actuatable region 128 of the second conductor 108 is raised with respect to the surrounding region 130 of the second conductor 108. One advantage of raising the actuatable region 128 relative to the surrounding region 130 of the second conductor 108 is that it increases the height 132 of the chamber 134 and thus provides an increased range of available deflection (e.g., the entire height 132 of the chamber wall 142) of the actuatable region 128. According to the illustrative embodiment, the height 132 of the chamber, and thus the amount by which the actuatable region 128 may be deflected, by as much as about 1 $\mu m$. However, in other illustrative embodiments, the height of the chamber 132 and the amount by which the actuatable region 128 may be deflected is at least about 2.5 $\mu m$, at least about 5.0 $\mu m$, at least about 7.5 $\mu m$, or at least about 10 $\mu m$. As in the illustrative embodiments of FIGS. 1A and 1B, the actuatable region 128 may also be deflected by as small of an amount as may be desirable for a particular application. For example, the deflection may, without limitation, be less than about 1 $\mu m$, 100 nanometers, 10 nanometers or 1 nanometer.

FIGS. 3A and 3B depict cross-sectional views of actuatably movable machines 144 and 146, respectively, according to another illustrative configuration. As in the case of the machines 100 and 124, the machine 144 includes a substrate 102, a first conductor 104 disposed on the substrate 102, an thin film 106 disposed on the first conductor 104, and a second conductor 108 disposed on the thin film 106. As in the case of the machines 120 and 126, the machine 146 also includes an electrical insulator 122 located between the first conductor 104 and the thin film 106. The machines 144 and 146 are substantially identical to the machines 124 and 126, respectively, except that they do not include a raised actuatable region. More specifically, the machines 144 and 146 both include a chamber 148. In the illustrative embodiment of FIG. 3A, the chamber 148 is directly bounded along a first peripheral section by an inner side 150 of a actuatable region 152 of the second conductor 108, and along a second peripheral section directly by an inner surface 154 of the first conductor 104. In the illustrative machine 146, the chamber 148 is bounded along the second peripheral section directly by an inner surface 156 of the insulator 122. In a similar fashion to the embodiments of FIGS. 2A and 2B, according to this configuration, the electrical insulator 122 prohibits the first 104 and second 108 conductors from forming an electrical short circuit in the event that the actuatable region 152 is fully deflected toward the first conductor 104. The electrical insulator 122 also prevents potential device heating resulting from the flow of DC current. As also in the case of the machines 124 and 126, the chamber 148 of FIGS. 3A and 3B is formed by displacing and/or removing at least a portion of the thin film 106 located below the actuatable region 152. As also in the case of the machines 124 and 126, the side wall(s) 158 of the chamber 148 is/are formed by the remaining thin film 106.

In contrast to the raised actuatable region 128 of the machines 124 and 126, the outer surface 160 of the actuatable region 152, in an unactuated undeflected state, can be substantially coplanar with the outer surface 162 of a surrounding portion of the second conductor 108. According to the illustrative embodiments of FIGS. 3A and 3B, the height 164 of the chamber 148, and thus the range of available actuatable region deflection, is determined by the thickness of the thin film 106. According to the illustrative embodiments of FIGS. 1A-3B, the thickness of the thin film 106, and thus the height 164 of the chamber 148, is between about 50 nm and about 500 nm. In other illustrative configurations, the thin film 106 may have a thickness 191 of less than about 50 nm, between about 50 nm and about 100 nm, between about 100 nm and about 150 nm, between about 150 nm and about 200 nm, between about 200 nm and about 250 nm, between about 250 nm and about 300 nm, between about 300 nm and about 350 nm, between about 350 nm and about 400 nm, between about 450 nm and about 500 nm, between about 500 nm and about 1 μm, or greater than about 1 μm. One advantage of the coplanar configuration of FIGS. 3A and 3B is that actuatable region 152 of the second conductor 162 remains hidden until deflected. Thus the surface sections 162 and 160 are substantially indistinguishable absent deflection of the actuatable region 152.

As mentioned above, in the case of the machines 100 and 120, the side of the chamber opposite the dome shaped actuatable region 110 and bounded by the peripheral section 116 may be substantially ovular, or in some embodiments, circular. Similarly, in the case of the machines of FIGS. 2A-3B, the same boundary of the chambers 134 and 154 may also be ovular, or in some embodiments, circular, and may have similar dimensions to the peripheral section 116. However, in other illustrative embodiments, the chamber bottom peripheral sections 138, 140, 154 and/or 156 may have any arbitrary shape. For example, they may be polygonal, rectangular, triangular, star shaped, zigzag shaped or the like. In addition, they may include straight sections and/or curved sections. In one configuration, the bottom peripheral sections 138, 140, 154 and/or 156 may be elongated to give the chambers 134 and/or 148 a conduit shape.

Any suitable materials may be employed for the various components of the illustrative machines 100, 120, 124, 126, 144 and 146 of the FIGS. 1A-4B. By way of example, the substrate 102 may be formed from any suitable light transmissive material, including any suitable flexible light transmissive material. According to the illustrative embodiments, the substrate 102 is formed from a silica glass. However, in other illustrative embodiments, the substrate 102 is formed from a flexible or rigid polymer plastic, such as polymethylmethacrylate (PMMA) or polyethylene terphthalate ((PET). The first conductor 104 is preferably formed from a light transmissive material, at least along a portion aligned with the actuatable region (e.g., regions 110, 128 and 152) of the second conductor 108. According to the illustrative embodiment, the first conductor 104 is formed from a transparent conductive oxide, such as without limitation, indium-tin-oxide (ITO) or aluminum-doped zinc oxide. Other suitable first conductor 104 materials include carbon nanotubes. According to the illustrative embodiments of FIGS. 1A-3B, the first conductor 104 is formed as a layer on top of the substrate 102 and has a thickness of between about 25 nm and about 300 nm thick. In particular implementations, the thickness of the first conductor may be less than about 25 nm, between about 25 nm and about 100 nm, between about 100 nm and about 150 nm, between about 150 nm and about 200 nm, between about 200 nm and about 250 nm, between about 250 nm and about 300 nm, between about 300 nm and about 1 μm, or greater than about 1 μm. The first conductor 104 may be applied to the substrate 102 by any suitable mechanism, including without limitation, by sputter deposition, thermal evaporation, or spin-coating.

As discussed in further detail below with reference to the diffractive beam patterning application of FIGS. 31A and 31B, according to some illustrative embodiments, the material for the first conductor 104 is selected for reduced electrical conductivity so as to be capable of supporting a potential difference across a region aligned with the actuatable region (e.g., 110, 128 and 152) of the second conductor 108. By creating a voltage gradient across the first conductor 104, the actuatable region (e.g., 110, 128 and 152) may be deflected at an angle, for example, for optical beam steering and image projection applications. As discussed in further detail below with reference to FIGS. 29A and 29B, a such a voltage gradient may also be applied across a series/array of actuatable machines of the type described above such that each machine along the gradient deflects more than the prior machine. This interference of light reflected off the individual machines results in an overall steering of the reflected beam. First conductor 104 materials suitable for such applications include, without limitation, indium-tin- oxide (ITO) or aluminum-doped zinc oxide.

The electrical insulator 122, when employed, is also preferably formed from a light transmissive material, such as silicon oxide ($SiO_2$) or aluminum oxide ($Al_2O_3$), or any other suitable material. According to the illustrative embodiments, the electrical insulator 122 is formed as a layer on top of the first conductor 104, at least in a region aligned with the actuatable region (e.g., 110, 128, 152) of the second conductor 108, and has a thickness of between about 25 nm and about 75 nm. However, in other illustrative embodiments, the insulator may be formed with any suitable dimensions, including those less than 25 nm and those greater than 75 nm. The insulator 122 may be applied to the first conductor 104 by any suitable mechanism, including without limitation, by sputter deposition, thermal evaporation, or spin-coating.

The thin film 106, according to the illustrative embodiments, is may be an organic thin film formed from an aromatic macrocycle, such as copper phthalocyanine (CuPC). However, in other illustrative configurations, the thin film 106 may be formed from a free-radical organic salt, such as tris-[dibutylphenyl(amine)]+:SbF6 (IR-99). According to further illustrative configurations, the thin film 106 may formed from any visible or near-infrared dye or pigment, or any suitable material, including any suitable polymer material. According to one illustrative implementation, an aromatic macrocycle capable of absorbing light in a range of between about 800 nm to about 1200 nm is used. In another illustrative implementation, a free-radical organic salt capable of absorbing light in a range of between about 400 nm to about 800 nm is used. According to the illustrative embodiment, the thin film 106 is formed as a layer directly on top of the first conductor 104, while in other implementations, the electrical and/or thermal insulator 122 is located intermediate to the first conductor 104 and the thin film 106.

The second conductor 108 may or may not be optically transparent. In some configurations, the second conductor 108 is not optically transparent and is formed an optically reflective material, such as without limitation, aluminum (Al). In such configurations, the actuatable region (e.g., 110, 128 and 154) is reflective on both inner (e.g., 114, 136 and 150) and outer (e.g., 115, 137 and 150) surfaces, enabling light incident on both outer and inner surfaces of the actuatable region to be reflected. In other implementations, the second conductor 108 is formed, at least along the actuatable region (e.g., 115, 137 and 150), from a light transmissive material, enabling the machine to act as an tunable optical filter, with tuning being accomplished by deflecting the actuatable region (e.g., 115, 137 and 150) to change the distance (e.g., the height 118, 132 and 164) between the first 104 and second 108 conductors within the chamber (e.g., 112, 134 and 148).

According to the illustrative embodiment, the second conductor 108 may be formed from a transparent conductive oxide, such as without limitation, indium-tin-oxide (ITO) or aluminum-doped zinc oxide. According to one illustrative implementations of FIGS. 1A-3B, the second conductor 108 is formed as a layer on top of the thin film 106 and has a thickness of between about 50 nm and about 300 nm thick. In particular illustrative implementations, the thickness of the second conductor 108 may be less than about 50 nm, between about 50 nm and about 100 nm, between about 100 nm and about 150 nm, between about 150 nm and about 200 nm, between about 200 nm and about 250 nm, between about 250 nm and about 300 nm, between about 300 nm and about 1 μm, or greater than about 1 μm.

Turning now to methods of manufacturing, the machines of the invention may be formed using any of a plurality of approaches. Commonalities between the approaches include: enabling the machines to be made relatively easily as compared with conventional fabrication approaches, providing improved yields, providing any arbitrary geometrical footprint, and optionally, enabling fabrication of an enclosed chamber. Although the fabrication methodologies of the invention are described with respect to the illustrative machines, they may be applied to fabrication of any suitable three dimensional structures, including those without actuatably movable parts.

Figure 4B:
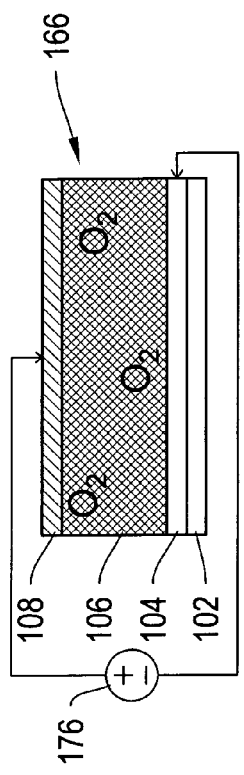
Figure 4C:
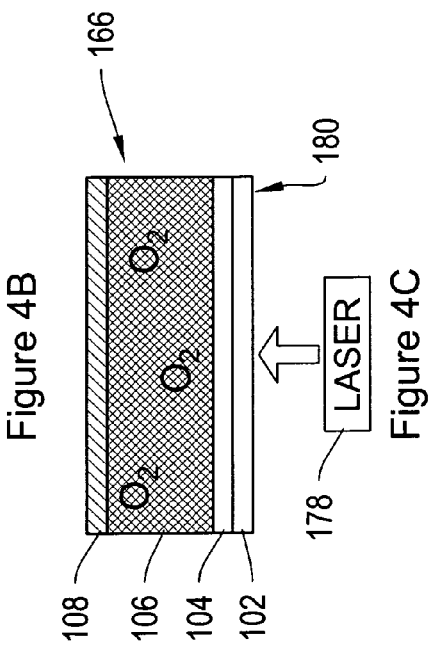

FIGS. 4A-4D illustrate exemplary approaches for fabricating one or more machines of the type depicted in FIGS. 1A and 1B. As shown in FIGS. 4A-4C, according to the various illustrative embodiments, the fabrication process employs a structure 166 including a substrate 102, a first conductor 104, an thin film 106, a second conductor 108, and optionally, an electrical and/or thermal insulator 122, such as described above with respect to the illustrative embodiments of FIGS. 1A-3B. However, any suitable structure may be employed with the fabrication methods of the invention.

Figure 4D:
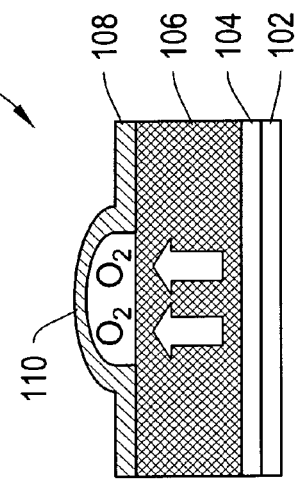

According to one approach, the structure 166 is subjected to substantially uniform heating. As shown in FIG. 4A, according to one illustrative embodiment, the structure 166 is placed in an oven and heated to a temperature sufficient to cause oxygen trapped in the thin film 106 to outgas and blister the second conductor 108. As shown in FIG. 4D, blistering results in the formation of one or more machines 100 having a dome shaped actuatable region 110, such as the illustrative embodiments of FIGS. 1A and 1B. The degree to which the structure 166 needs to be heated and the time duration for which the structure 166 is heated depends on the dimensions and materials of the structure 166.

As shown in FIG. 4B, according to another illustrative embodiment, a voltage source 176 is placed across the conductors 104 and 108 to inject a DC current through the thin film 106 at a sufficient level and for a sufficient time to cause the heating necessary to cause the oxygen outgassing. As in the case of the illustrative embodiment of FIG. 4A, one or more structures 100 are formed.

As shown in FIG. 4C, according to another illustrative embodiment, a continuous wave (CW) laser 178 is applied to a bottom side 180 of the substrate 102 to provide the heating necessary to cause the oxygen outgassing and form the one or more structures 170 of FIG. 4D. One advantage of the CW laser approach is that the heating can be localized to better control the location of the dome shaped structures in the second conductor 108.

As shown in FIGS. 5A and 5B, according to another illustrative approach, the machines of the invention are formed by direct writing them into a structure, such as the structure 188, with a laser. As shown in FIG. 5B, this approach includes applying a focused laser 184 to the thin film layer 106 through the bottom 180 of the substrate 102, the first conductive layer 104, and optionally, the insulator 122, to create at least one actuatably movable machine 124. As described above with respect to FIGS. 2A and 2B, the machine 124 includes an enclosed chamber 134 bounded along a first peripheral section by an inner side 136 of the actuatable region 128 of the second conductor 108, and along a second peripheral section directly by an inner surface 138 of the first conductor 104. The side wall(s) 142 of the chamber 134 is/are formed by the remaining thin film 106.

According to the illustrative embodiment, the laser 184 is an ultra fast pulsed laser. Each laser pulse may have a pulse width, for example, of less than or equal to about 250 fsec 200 fsec or 100 fsec. The laser 184 may also apply a maximum energy of less than or equal to about 50 nano-Joules/pulse, less than or equal to about 40 nano-Joules/pulse, or less than or equal to about 30 nano-Joules/pulse. In other implementations, the laser may employ pulses having widths on the order of picoseconds or nanoseconds. Additionally, the energy applied may be on the order of microjoules, for example, depending on the pulse width, repetition rate, and wavelength of the laser. As with other parameters discussed herein, the particular parameters employed for fabricating the structures of the invention are dependant, for example, on the materials used and the desired dimensions of the machine being fabricated.

The illustrative laser 184 has a wavelength of 800 nm. However, any suitable wavelength may be employed. According to one feature, the wavelength of the laser 184 is selected so that the laser light can pass through the substrate 102, the first conductor 104, and optionally, the insulator 122 to interact with the thin film 106. According to the illustrative embodiment, the laser 184 collimates to a spot having a diameter about equal to the diameter/width 192 of the chamber. However, this need not be the case, since the laser 184 can be used to direct write any pattern into the thin film 106, and thus form a chamber 134 having any desired shape. According to various embodiments, the diameter of the laser spot is less than or equal to about 300 micrometers, less than or equal to about 250 micrometers, less than or equal to about 200 micrometers, less than or equal to about 150 micrometers, less than or equal to about 100 micrometers, or less than or equal to about 50 micrometers. According to alternative embodiments, the laser spot may be collimated to a diameter of greater than 300 micrometers, and may be collimated to a spot on the order of millimeters, centimeters, decimeters or larger. As the spot diameter increases, laser power is increased to provide the required intensity, with spot size being limited, at least in part, by practical stability requirements of the fabricated structures.

As shown in FIG. 5B, the laser 184 disperses the thin film 106 from an original location below the dashed line 186 to a raised annular region 188 located between a periphery of the actuatable region 128 and the dashed line 186. As mentioned above, the conceptual drawings of FIGS. 1A-5B are not to scale. For example, in the illustrative embodiment of FIG. 5B, the height 190 is far greater than the thickness of the thin film 106. More specifically, while the thickness of the thin film is about 250 nm. The height 190 is about 1 µm and accounts for the vast majority of the height 132 of the chamber 134.

According to other illustrative embodiments, the above described ultra fast pulsed laser approach may be employed to machines where the actuatable region is not raised, and instead a top surface of the actuatable region may be substantially coplanar with a surrounding area of the second conductor, such as shown and described with respect to FIGS. 3A and 3B. To create such structures, the laser 184 may be adjusted to decrease the beam intensity and increase the exposure time. The thin film material 106 contained within the chamber may be dispersed by the laser, for example, by causing it to diffuse through the conductor 108, dispersing it into the remainder of the thin film 106, and or causing it to build up on the inside (e.g., the wall(s)) of the chamber 148.

FIG. 6A is a graph 194 depicting a Gaussian intensity profile for a laser. FIG. 6B is a top view of a second electrode 196, such as the second electrode 108, of a machine of the invention. As shown, a laser intensity greater than a threshold intensity $I_{th}$ is required before the laser interacts with the thin film to create a chamber, such as the chamber 134, and thus a deflectable region 198, such as the deflectable region 128. Alternatively, if the region 200 is exposed to a laser intensity less than the requisite $I_{th}$, the thin film may still be pushed up, such as in the region 188 of FIG. 6B, but too much thin film remains below to allow the region 200 to deflect.

FIGS. 7A is a graph 202 illustrating a laser having a more rectangular shaped intensity profile. FIG. 7B is a top view of a second electrode 208 resulting from use of a laser having the profile of FIG. 7A. As shown in FIG. 7A, substantially the entire beam has an intensity above $I_{th}$, which causes the actuatable region 204 to be a larger percentage of the size of the raised portion 206 of the second conductor 208. The percentage of usable deflectable space 204 relative to the entire raised portion 206 is referred to as the fill factor. The greater the fill factor, the more closely the machines of the invention can be packed together on a particular structure.

FIG. 8 is a conceptual diagram 210 depicting how a plano-convex lens 212 may be used to transform a laser having the Gaussian intensity distribution 214 into a laser having a distribution 216 more closely resembling the rectangular intensity distribution of FIG. 7A. In the graphs of FIG. 8, $I_{th}$ refers to laser intensity, (r) refers to radius of the laser wave front, and $d_{mod}$ refers to the diameter of the chamber and thus, the diameter of the actuatable region of the second conductor. FIG. 9 is a conceptual diagram depicting how an optical phase delay element may be used in combination with a Fourier lens to transform the a laser having the Gaussian intensity distribution 214 into a laser having a substantially rectangular intensity distribution 224.

Figure 10:
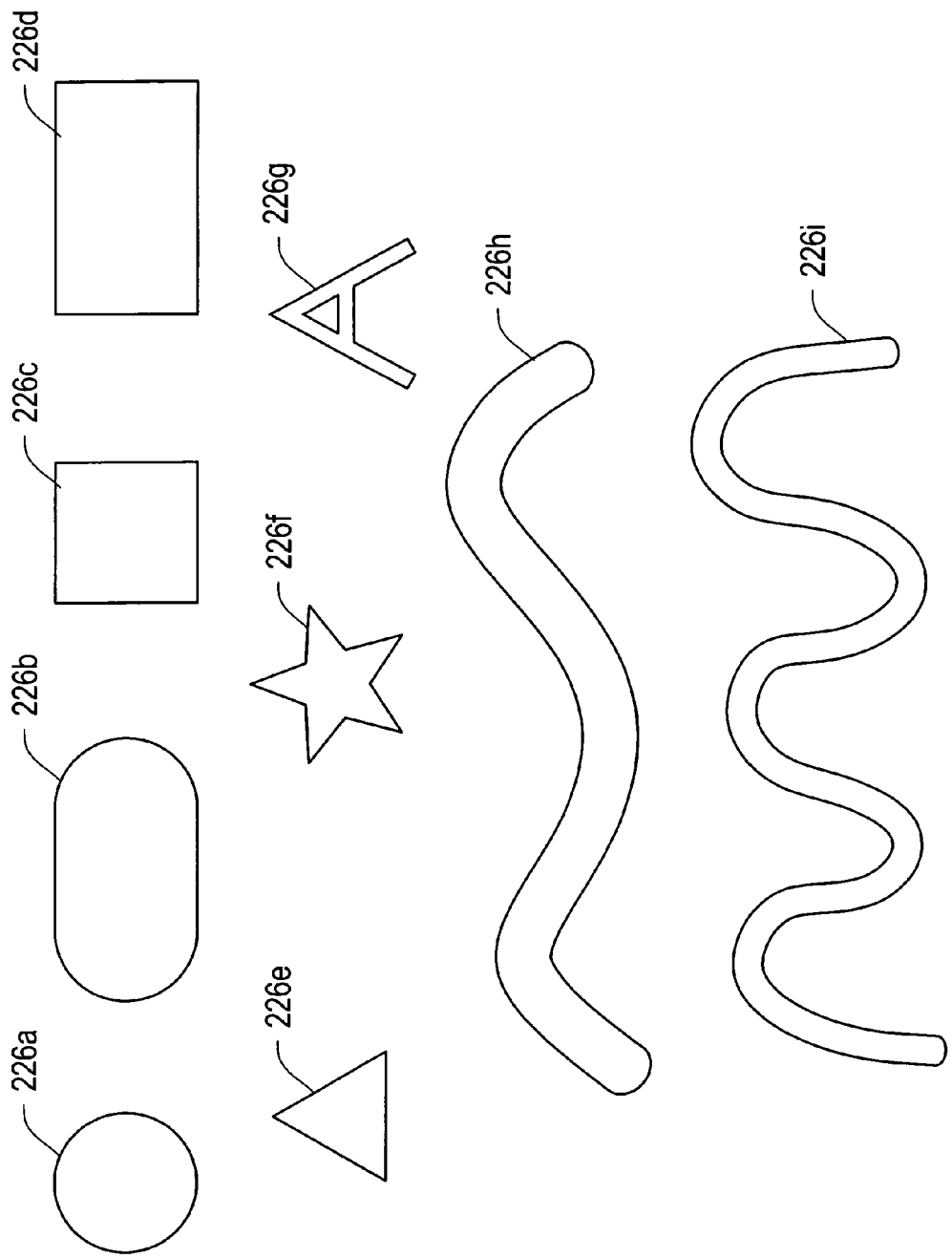
FIG. 10 depict examples of geometrical shapes into which the machines of FIGS. 2A-3B can be formed.
Figure 11:
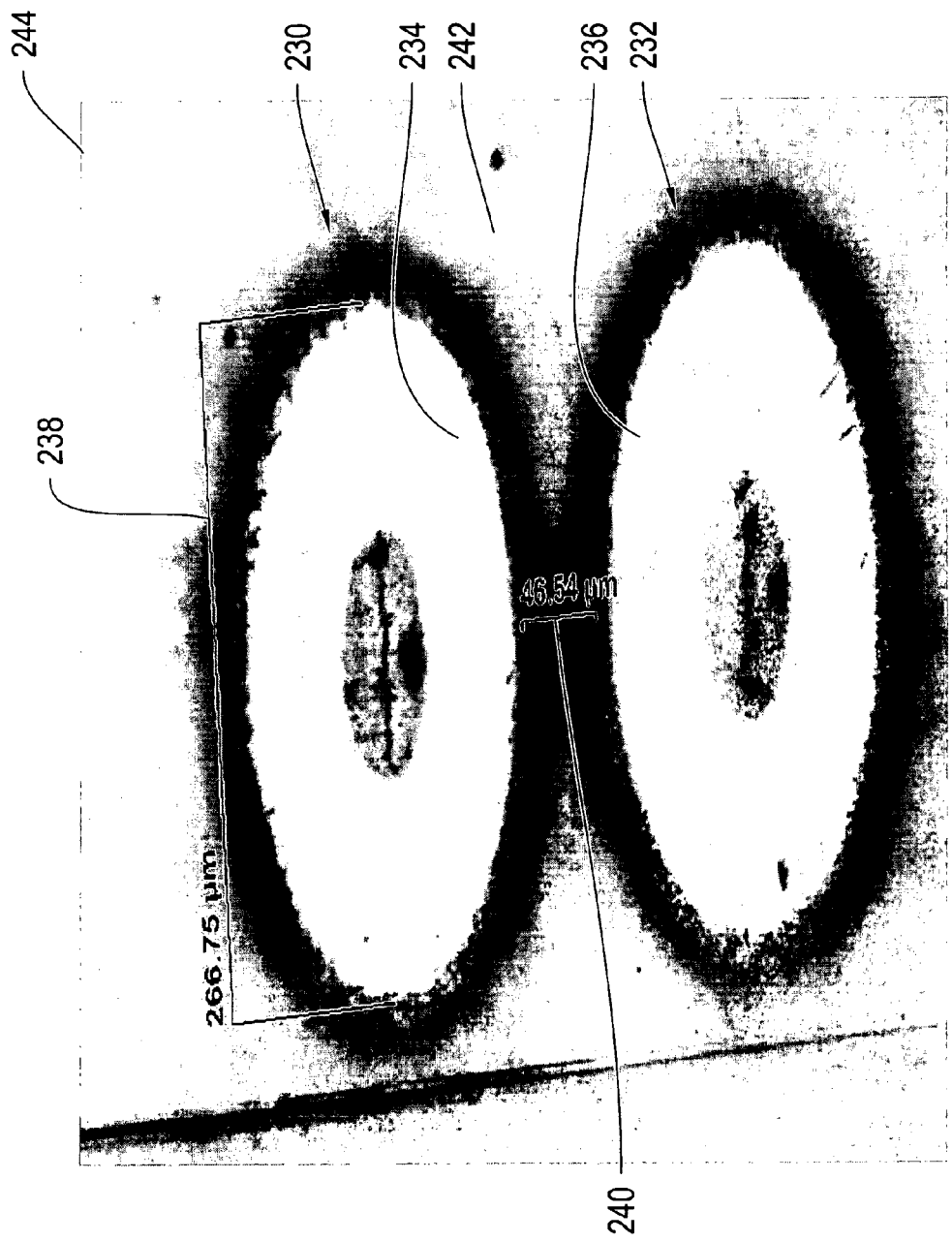
FIG. 11 is an image of a pair of illustrative circular shaped actuatably movable machines of the type depicted in FIG. 2A formed using processes of the invention.

As mentioned above, the direct laser writing methodology of the invention may be used to create machines having actuatable regions, and thus chambers, of any arbitrary size, shape and pattern. FIG. 10 shows a top view a various exemplary actuatable regions 226a-226i of the type that may be created in a structure 228, of the type depicted at 168 in FIG. 5A. The actuatable regions 226a-226i may be created individually or in combination on the same structure, and may be shaped, without limitation, as a circle 226a, oval 226b, square 226c, rectangle 226d, triangle 226e, star 226f, an alpha-numeric character 226g, an elongated curve 226h, or a more compact curve 226i. Additionally, each of the structures may be formed from a single machine of the invention, or may be formed from a plurality of overlapping machines. FIG. 11 shows a top perspective view of two substantially identical actuatably movable machines 230 and 232 fabricated using a direct laser writing methodology, such as the ultra fast laser machining approach described with respect to FIGS. 5A and 5B. As shown, the actuatable regions 234 and 236 both have a diameter 238 of about 266.75 µm. As also shown the distance 240 between the actuatable regions 234 and 236 is about 46.54 µm. According to the illustrative example of FIG. 11, the laser 184 had a wavelength of 800 nm, a pulse width of 100 fsec, and delivered about 1 W of power to each location on the bottom side 180 of the substrate 102. Each location on the bottom side 180 of the substrate 102 was exposed to the laser 184 for about 3 seconds. The substrate 102 was formed from glass, the first conductor 104 from Indium Tin Oxide (ITO), the thin film 106 from CuPc, and the second conductor 108 from aluminum (Al). Both the substrate 102 and the first conductor 104 were selected to be substantially transparent to the 800 nm wavelength of the light from the laser 184. The thin film 106 had a thickness of about 250 nm. As in the case of the illustrative embodiment of FIG. 5B, the actuatable regions 234 and 236 are raised with respect to a surrounding portion 242 of the second conductor 244.

Figure 12:
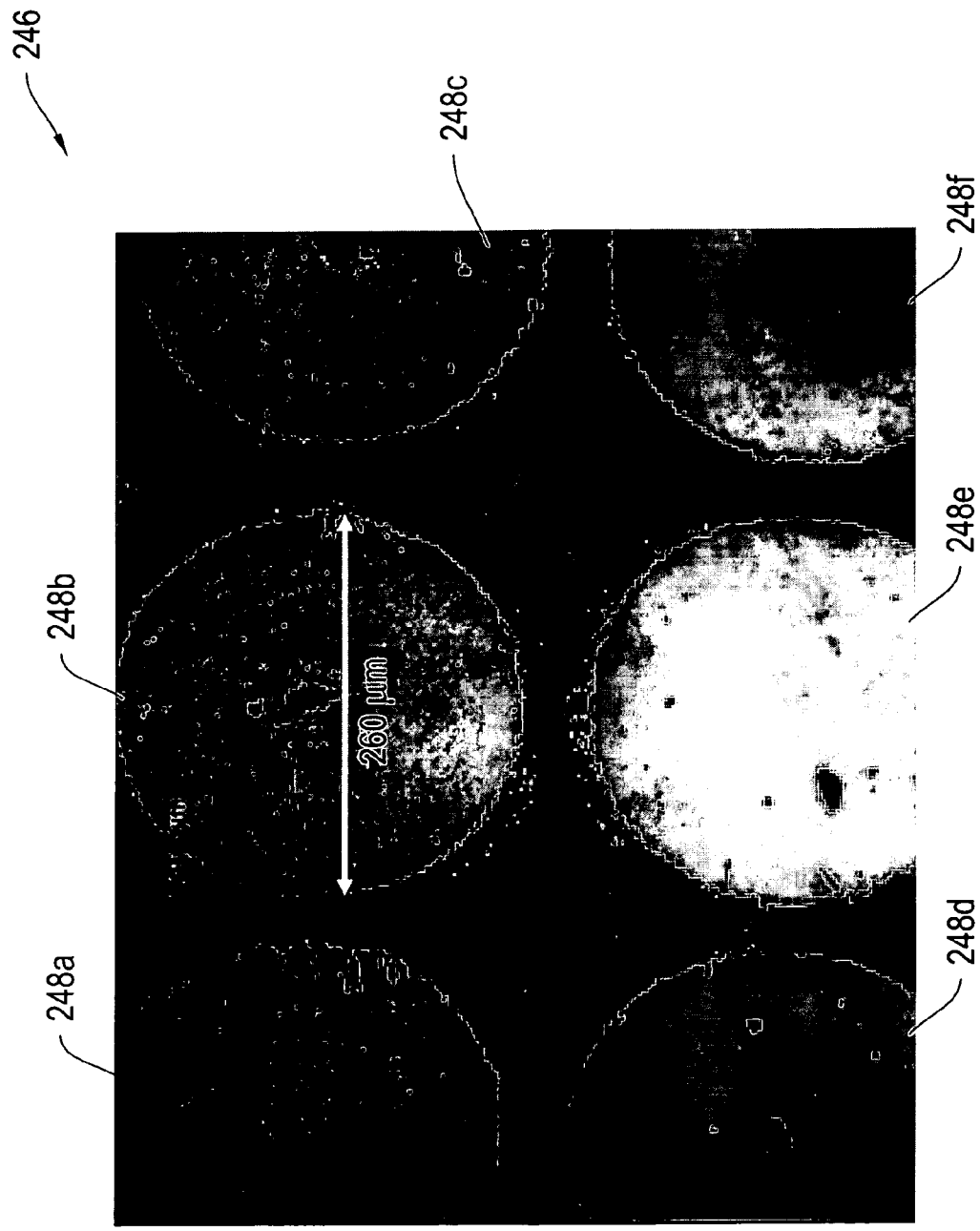
FIG. 12 is an image of an array of six illustrative circular shaped actuatably movable machines of the type depicted in FIG. 2A formed using processes of the invention.

FIG. 12 shows a top view of an array 246 of machines 248a-248f of the type shown FIG. 11 and formed using the ultra fast laser machining approach of the invention. The laser parameters and initial structure used to create the structures of FIG. 12 were substantially the same as those used to create the structures of FIG. 11, except that the laser spot employed for the structures of FIG. 12 was slightly smaller than that used for the structures of FIG. 11.

Figure 13:
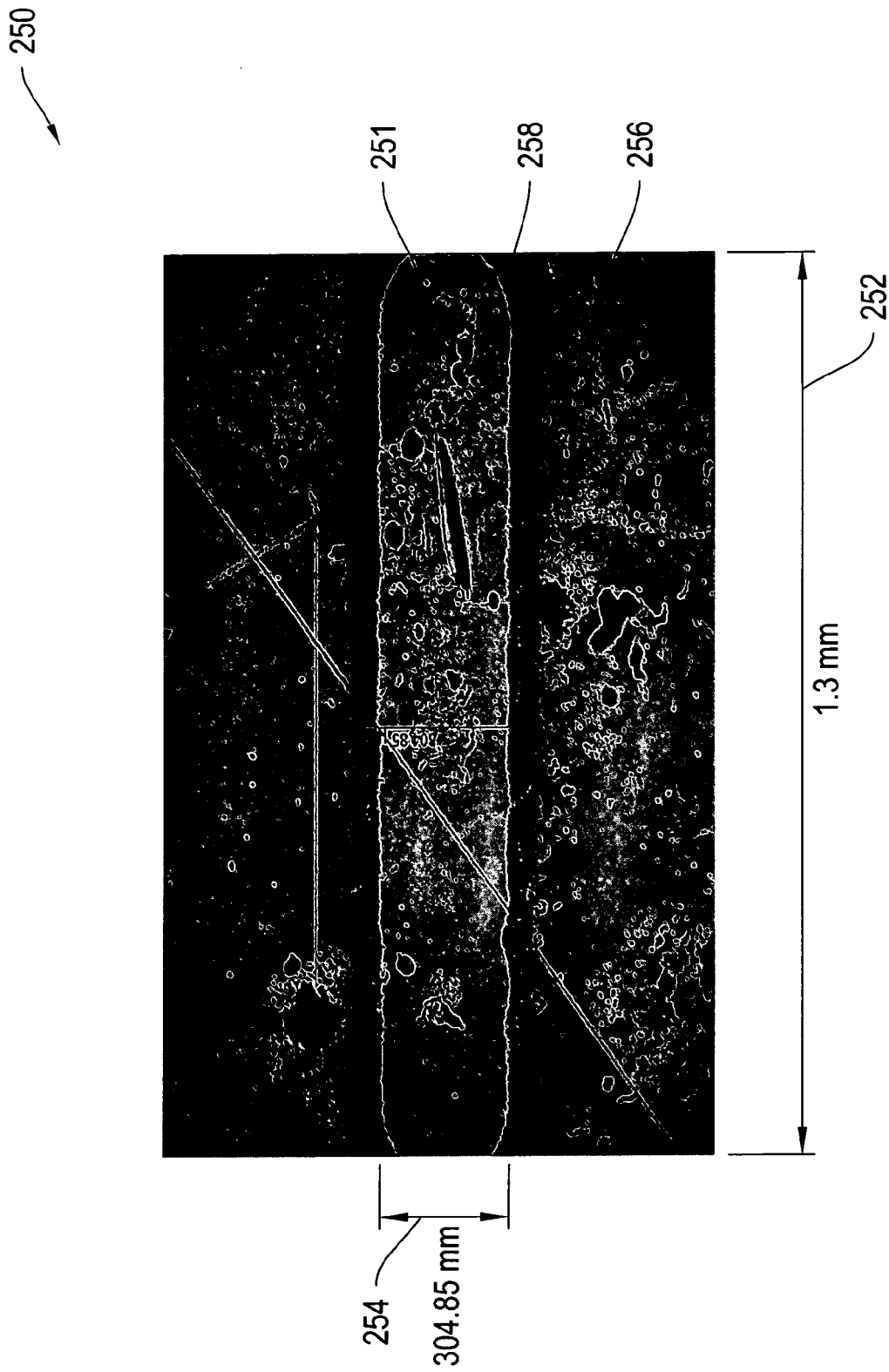
FIG. 13 is an illustrative elongated actuatably movable machine of the type depicted in FIG. 2A formed using processes of the invention.

As described above, the machines of the invention may be created with an actuatable region of any arbitrary shape. FIG. 13 is a top view of a machine 250 of the invention having an elongated shape. As shown, the machine 250 has an actuatable region 251 with a length 252 of about 1.3 mm and a width 254 of about 300 µm. The machine 250 was formed using the above described laser direct writing techniques and a structure of the type employed in FIGS. 1B, 2B and 3B. More specifically, the substrate 102 was formed from glass, the first conductor 104 from Indium Tin Oxide (ITO), the thin film 106 from CuPc, the insulator 122 from silica and the second conductor 108 from aluminum (Al). Both the substrate 102, the first conductor 104 and the insulator 122 were selected to be substantially transparent to the 800 nm wavelength of the light from the laser 184. The thin film 106 had a thickness of about 250 nm and the second conductor 108 had a thickness of 100 nm.

In the illustrative embodiment of FIG. 13, the laser 184 had a wavelength of 800 nm, a pulse width of 100 fsec, and delivered about 1 W of total average power to the bottom side 180 of the substrate 102. The initial structure was placed on a translation stage and moved to a known position relative to a 10× microscope objective (the primary beam focusing optic). A micrometer screw mounted on a vertical stage of the microscope was adjusted to provide a laser spot having a diameter of about 305 µm (specifically 304.85 µm). An operator then manually scanned the laser 184 along the length 252 of the structure. As discussed in further detail below, in other illustrative embodiments, the laser 184 may be scanned with the aid of a 2-axis computer controlled translation stage, which also allows for the scan speed to be precisely set and controlled. As mentioned above and also discussed in further detail below, the laser 184 may be scanned in an x-y plan in any pattern to form a machine of the invention having any arbitrary shape. According to another feature, the relative position between the laser 184 and the initial structure may be dynamically varied during the scanning process to vary the width 254 of the actuatable region 251.

As in the case of the illustrative embodiment of FIG. 5B, the actuatable region 251 is raised with respect to a surrounding portion 254 of the second conductor. The dark region 258 indicates a peripheral area, which is above a chamber formed in the thin film, but which is not actuatable. This is analogous to the area 206 in FIG. 7B and results from the intensity profile of the laser 184.

Although structures having a relatively large actuatable region width, such as the with 254 of FIG. 13 may be useful for some applications, other applications, such as optimized beam steering, may require much narrower widths. By varying the size of the laser spot and the exposure time/sample stage scan speed, microstructures of various widths have been successfully formed. Additionally, by placing neutral density (ND) filters in the laser beam path to reduce the total delivered power, microstructures with unraised actuatable regions, such as those depicted in FIGS. 3A and 3B have also been formed.

FIGS. 14A-14D show several machines of the invention having widths ranging from 17 µm to 40 µm, and having unraised actuatable regions with top surfaces that remain substantially coplanar with a surrounding second conductor top surface. In such structures, the actuatable region may be substantially or entirely invisible when viewed from a top side of the second conductor in an unactuated state. Accordingly, the images of FIGS. 14A-14D are microscope images of the sample as observed through the substrate 102. The bright, uniform reflection observed for all 4 structures indicate that either all or most of the CuPc has been ablated/removed, thus exposing the reflective aluminum mirror to the microscope illumination. Since the aluminum structures are very smooth, they modulate light more efficiently than they would if the surface was highly textured (non-uniform stresses on the structure). Textured aluminum surfaces have been observed and appear to represent an over exposure of the sample to the laser light. In such a case, the laser is starting to process the aluminum.

The structures of FIGS. 14A-14D were formed using the laser direct writing techniques of the invention. In all 4 cases, the initial structure was substantially the same as the initial structure employed in the illustrative embodiment of FIG. 13, except that the thin film 106 had a thickness of about 100 nm, rather than about 250 nm. The laser 184 had a wavelength of 800 nm, a pulse width of 100 fsec, and a total average power of about 300 mW.

In the case of the machine 260 of FIG. 14A, the vertical stage was set to provide a distance of 0.25 mm between the focal point of the microscope objective and the bottom (coated) side 180 of the substrate 102, the laser was scanned along the length 268 of the structure at a speed of 1 µm/sec, and no ND filter was employed. The resulting machine 260 had a length 268 of about 500 µm and a width 270 of about 25 µm. The apparent fringe pattern 261 along the edges of the machine 260 are areas of the sample where the laser intensity was too low to do complete processing, and thus no chamber was fully formed. The large circle 272 visible on the left side of the line is an aluminum "bubble" resulting from the initial exposure of the sample to the laser beam. The diameter of the bubble 272 varies with laser intensity and sample thickness. The particular bubble 272 has a diameter of about 100 µm and a height (e.g., the amount by which the bubble 272 is raised above a surrounding surface of the second conductor 108) of about 3-4 µm.

In the case of the machine 262 of FIG. 14B, the vertical stage was set to provide a distance of 0.15 mm between the focal point of the microscope objective and the bottom (coated) side 180 of the substrate 102, the laser was scanned along the length 274 of the structure at a speed of 1 µm/sec, and no ND filter was employed. The resulting machine 262 had a length 274 of about 500 µm and a width 276 of about 25 µm. The bubble 278 had a diameter of about 50 µm. The height of the bubble 278 was not measured.

In the case of the machine 264 of FIG. 14C, the vertical stage was set to provide a distance of 0.05 mm between the focal point of the microscope objective and the bottom (coated) side 180 of the substrate 102, the laser was scanned along the length 280 of the structure at a speed of 1 µm/sec, and a neutral density (ND) filter of 0.01 was employed. The resulting machine 264 had a length 280 of about 500 µm and a width 282 of about 17 µm.

In the case of the machine 266 of FIG. 14D, the vertical stage was set to provide a distance of 0.3 mm between the focal point of the microscope objective and the bottom (coated) side 180 of the substrate 102, the laser was scanned along the length 286 of the structure at a speed of 1 µm/sec, and no ND filter was employed. The resulting machine 266 had a length 286 of about 500 µm and a width 288 of about 25 µm. The bubble 290 had a diameter of about 100 µm. The height of the bubble 290 was not measured.

It should be noted that although the machines of FIGS. 14A-14D were fabricated by scanning the laser along the length of the structure, the structure may instead be moved while holding the laser position constant. Additionally, as in the case of all of the machines described herein, rather than fabricating the machines of FIGS. 14A-14D from a continuous scan, they may be fabricated, by forming a plurality of smaller, overlapping machines.

Figures 15A, 15B:
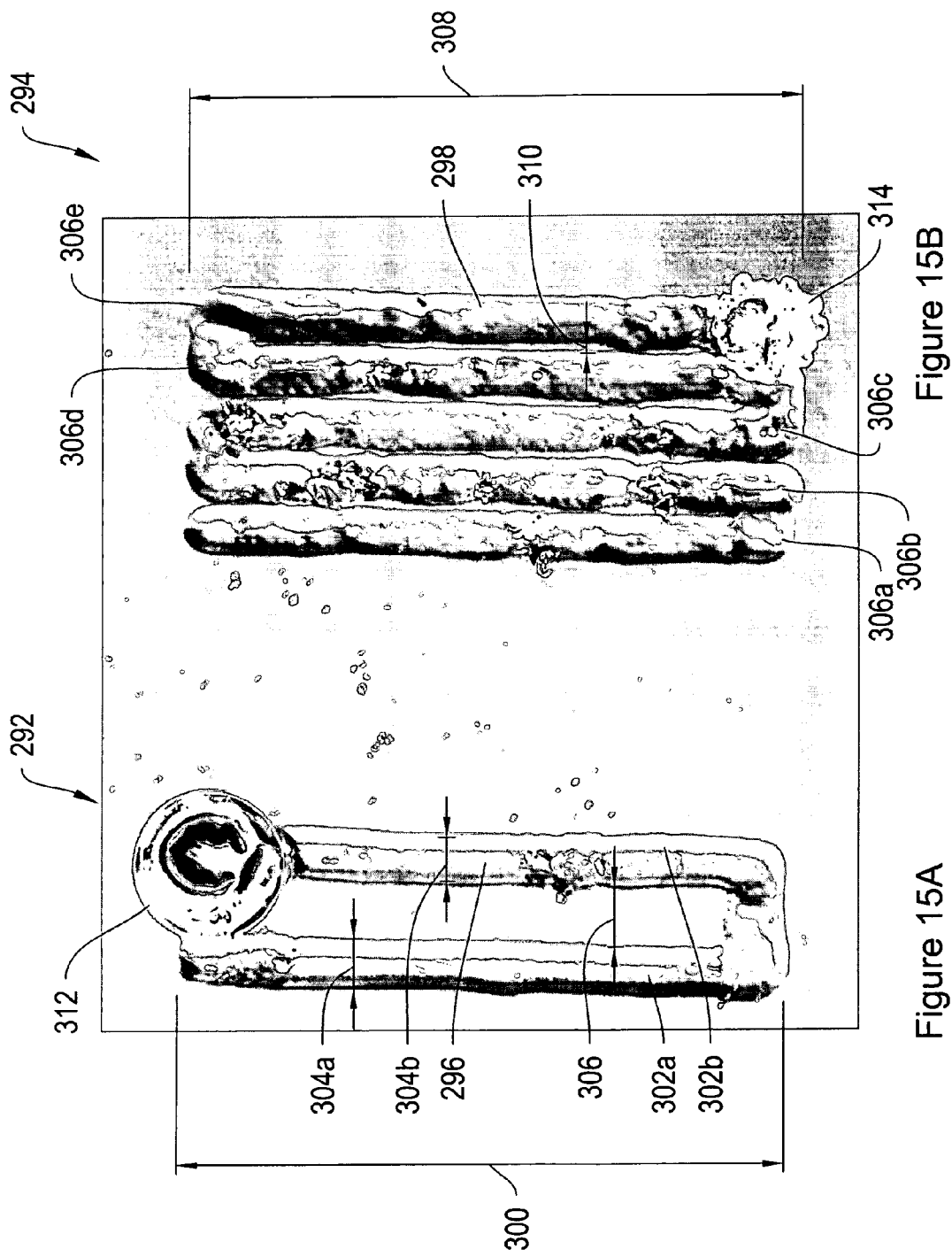
FIG. 15A depicts a U-shaped actuatably movable machine of the type depicted in FIG. 3A formed using processes of the invention.
FIG. 15B depicts a zig-zag shaped actuatably movable machine of the type depicted in FIG. 3A formed using processes of the invention.

FIGS. 15A and 15B show two additional illustrative machines 292 and 294 of the invention. Both of the machines 292 and 294 were formed using the direct laser writing techniques of FIGS. 14A-14D and unraised actuatable regions

296 and 298, respectively, with top surfaces that remain substantially coplanar with a surrounding second conductor top surface. To provide the microscopic images of FIGS. 15A and 15B, the a DC bias of 8 Volts was applied between the first and second conductors of each device.

The structures of FIGS. 15A and 15B were formed using the laser direct writing techniques of the invention. In both cases, the initial structure was substantially the same as the initial structure employed in the illustrative embodiment of FIG. 13, except that the thin film 106 had a thickness of about 200 nm, rather than about 250 nm, and the laser power was about 300 mW rather than about 1 W. The laser 184 had a wavelength of 800 nm and a pulse width of 100 fsec. The scan speed was set to 1 μm/sec, the vertical stage was set to provide a distance of 0.15 mm between the focal point of the microscope objective and the bottom (coated) side 180 of the substrate 102, and no ND filter was used.

The U-shaped structure 292 of FIG. 15A has a height 300 of 500 μm. Each leg 302a and 302b has a corresponding actuatable region width 304a and 304b of slightly less than about 50 μm, and are separated by a distance 306 of about 100 μm. In the linked U-shaped structures (or zigzag pattern) 294 of FIG. 15B, each of the legs 306a-306e also have a corresponding actuatable region width of slightly les than 50 μm. However, the gap 310 between each of the actuatable regions is less than about 2 μm, leading to a high fill factor. Once again, both structures 292 and 294 include bubble formations 312 and 314, respectively, resulting from damage to the aluminum second conductor/reflector 108 when beginning the fabrication process. Both structures 292 and 294 also include spots along the actuatable regions, which are likely the result of a combination of a damaged second conductor 108 coating and the laser 186 falling out of mode-lock and free lasing, both relatively easily correctable issues.

Turning now to methods of operation, a control (or other) voltage may be applied across the first 104 and second 108 conductors of any of the above described actuatably movable machines of the invention to cause the actuatable region (e.g., the curved dome 110, the raised diaphragm 128, or the coplanar diaphragm 152) to deflect and thus alter its light reflecting properties.

FIGS. 16A and 16B illustrate the operation of the machine 100 of FIG. 1A. More specifically, FIGS. 16A and 16B conceptually depict a system 316 including a voltage source 318 and a actuatably movable machine 100 of the type depicted in FIG. 1A. The source 318 may supply an AC or DC voltage, and in the case of an AC voltage may be of any suitable waveform, frequency and period. Additionally, the voltage source 318 may be, for example, a control voltage, such as may be the case when using the device 100 as an optical modulator or filter, or may an output from a sensor, such as may be the case when using the device 100 as an optical interrogation interface to a sensor. In the particular embodiment of FIGS. 16A and 16B, the second conductor 108 is formed from a reflective material, such as aluminum, and the substrate 102, first conductor 104 and thin film 106 are all optically transmissive.

With a zero bias applied across the first and second conductors (e.g., first and second electrodes) 104 and 108, respectively, the dome shaped actuatable region 110 of the second conductor 108 remains undeflected. As shown at 322, in this state, light 320 incident on the concave reflective inside surface 114 of the actuatable region 110, through the substrate 102, first conductor 104 and thin film 106, is scattered. In a similar fashion, as indicated at 323, light 321 incident on the convex outer surface 115 of the actuatable region 110 is also scattered.

In response to the source 318 applying a sufficient bias voltage (e.g., about 1-10 V), an electric field forms between the first 104 and second 108 electrodes, causing the flexible actuatable region 110 to deflect toward the thin film 106. In response to a sufficient bias voltage, the actuatable region 110 deflects far enough to bottom out on the thin film 106, bringing the inner surface 114 of the actuatable region 110 of the conductor 108 into contact with the upper surface 116 of the thin film 106. As indicated by the arrows 324, in the fully deflected/actuated state of FIG. 16B, the reflective inner surface 114 of the actuatable region 110 becomes flat enough to reflect light incident on the surface 114, rather than scattering it. Similarly, as indicated by the arrows 326, light incident on the outer surface 115 is also reflected.

According to one feature, varying control the level of the control voltage 318 achieves varying degrees of deflection of the actuatable region 110 toward the thin film 106. According to another feature, in intermediate states of actuation (e.g., having a sufficient control voltage 318 applied to cause the actuatable region 110 to deflect toward, but not contact with the thin film 106), the actuatable region 110 includes one or more substantially flat sections for reflecting light with reduced or substantially no scattering. In response to the control voltage being taken away, the actuatable region 110 is sufficiently resilient to return to its initial shape.

According to various illustrative implementations, the voltage source 318 provides a voltage, having a frequency of between about 0 kHz and about 100 MHz and an amplitude sweeping from 0 $V_{peak}$ to about 10 $V_{peak}$. In other implementations, the voltage swings between about $-20 V_{peak}$ to about $20 V_{peak}$, $-10 V_{peak}$ to about $10 V_{peak}$, or about $-5 V_{peak}$ to about $-5 V_{peak}$. According to additional implementations, higher voltages may be used to accommodate the thickness of the particular layers of the machine.

Figures 17A, 17B:
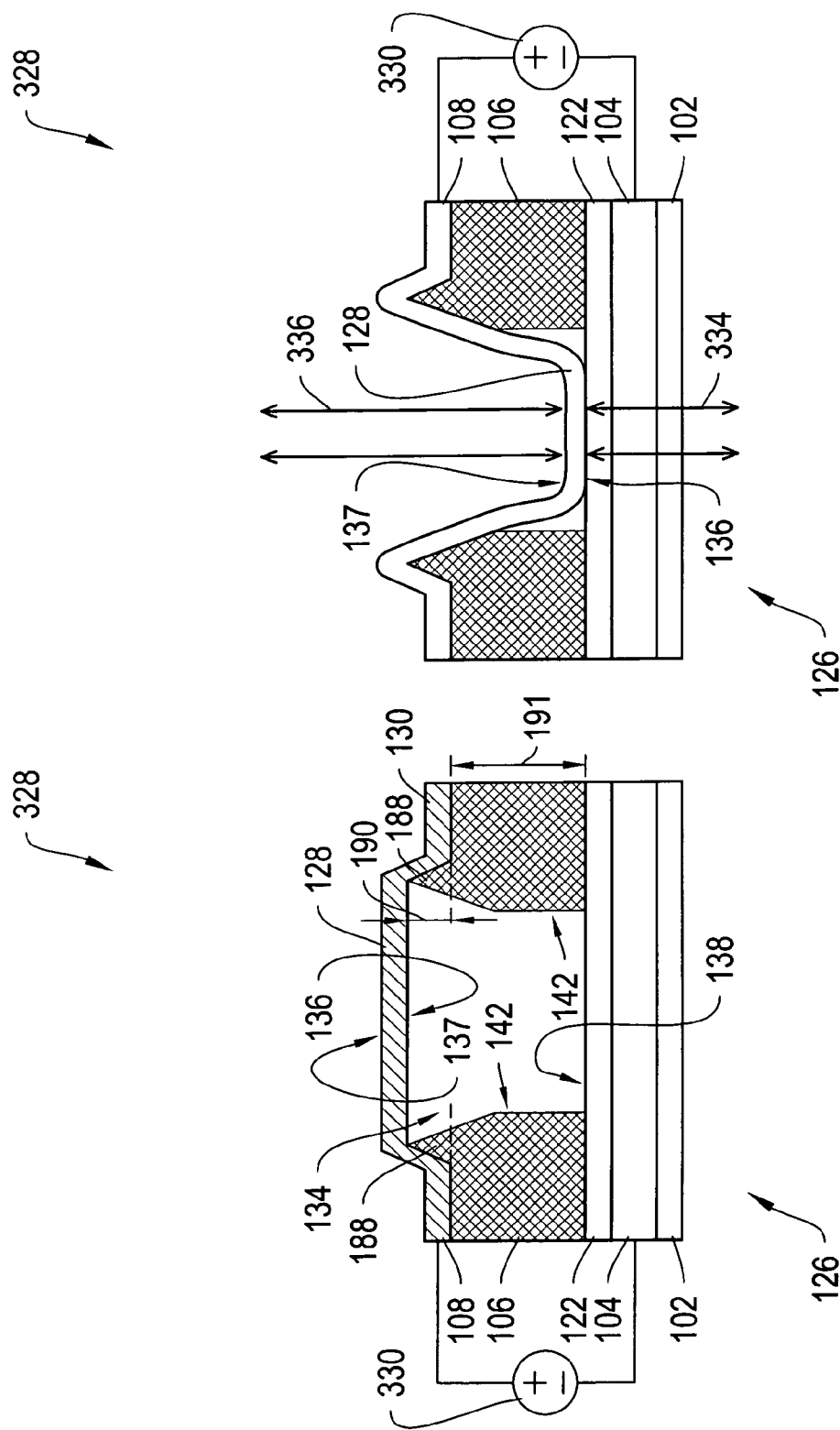
FIGS. 17A and 17B conceptually depict operation of the actuatably movable machine of FIG. 2A.

FIGS. 17A and 17B illustrate the operation of the machine 126 of FIG. 2B. More specifically, FIGS. 17A and 17B conceptually depict a system 328 including a voltage source 330 and the actuatably movable machine 126. The source 328 is of the same type as the voltage source 318 described above. As in the case of the illustrative embodiment of FIGS. 16A and 16B, the second conductor 108 is formed from a reflective material, such as aluminum, and the substrate 102, first conductor 104 and thin film 106 are all optically transmissive. Since the thin film 106 is removed and/or displaced under the actuatable region 128, the machine 126 also employs an electrical insulator 122, which as described above with regard to FIG. 2B, ensures that the first 104 and second 108 conductors do not short circuit with the actuatable region 128 in a fully deflected state and that no current is drawn by the machine 126. As in the case of the dome shaped actuatable region of FIGS. 16A and 16B, with a zero bias applied across the first 104 and second 108 conductors (e.g., first and second electrodes), the actuatable region 128 remains undeflected. However, as shown in FIG. 17A, in contrast to the embodiment of FIG. 16B, in this state, both the inner 136 and outer 137 surfaces of the actuatable region 128 remain substantially flat. Thus, rather than scattering, light 334, 336 incident on either the inner 136 or outer 137 surfaces of the actuatable region 128 reflects.

As in the case of the illustrative embodiment of FIGS. 16A and 16B, in response to the source 330 applying a sufficient bias voltage (e.g., about 1-10 V, or other suitable voltage), an electric field forms between the first 104 and second 108 electrodes, causing the flexible actuatable region 110 to deflect toward the thin film 106. In response to a sufficient bias voltage, the actuatable region 128 deflects far enough to bottom out on the thin film 106, bringing the inner surface 114 of the actuatable region 128 of the conductor 108 into contact with the upper surface 116 of the thin film 106. As indicated by the arrows 334 and 336, in the fully deflected/actuated state of FIG. 17B, the reflective inner surface 136 of the actuatable region 128 continues to be flat enough to reflect incident light. Similarly, as indicated by arrows 336, light incident on the outer surface 137 is also reflected.

As in the illustrative embodiment of FIGS. 16A and 16B, varying the level of the control voltage 330 achieves varying degrees of deflection of the actuatable region 128 toward the thin film 106. According to another feature, in intermediate states of actuation, the actuatable region 128, rather than having discrete sections (reduced in size from the size of the reflective surface available in the fully actuated state of FIG. 16B) that remain flat enough to reflect, stays substantially flat. According to various illustrative embodiments, in intermediate states of actuation, the substantially flat portion of the actuatable region 128 remains at least about 60%, 70%, 80%, or 90% of the size of the substantially flat portion of the actuatable region in the fully actuated state. As in the case of the machine 100, in response to the control voltage 330 being taken away, the actuatable region 128 is sufficiently resilient to return to its initial shape.

As mentioned above with respect to FIGS. 2A and 2B, in various illustrative embodiments, the thickness 191 of the thin film is between about 50 nm and about 1 μm and the height 191 of the raised portion of the thin film 106 is between about 1 μm and about 10 μm. However, as in the case of the above embodiments, any suitable dimensions may be employed, including without limitation, thin films having a thickness of up to about 10 μm. Additionally, depending on the particular application, the film 106 may exceed what would be considered a traditional thin film dimension, and have a thickness of greater than 10 μm. Thus, in this illustrative embodiment, the range of deflection of the actuatable region 128 is between about 1 μm and a bit more than about 10 μm. The large range of deflection, in combination with the actuatable region 128 being flat in both the unactuated, fully actuated, and optionally, intermediately actuated states, makes the structure 126 ideal for applications involving controlled light modulation, and precisely controlled optical filters, such as Fabret Perot optical filters.

Figure 18B:
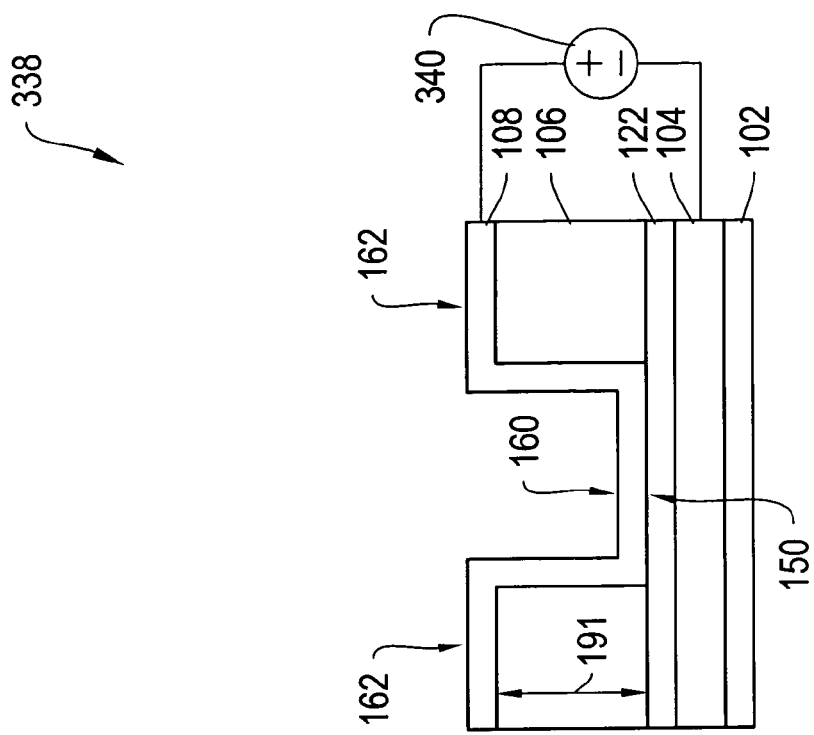
FIGS. 18A and 18B conceptually depict operation of the actuatably movable machine of FIG. 3A.
Figure 18A:
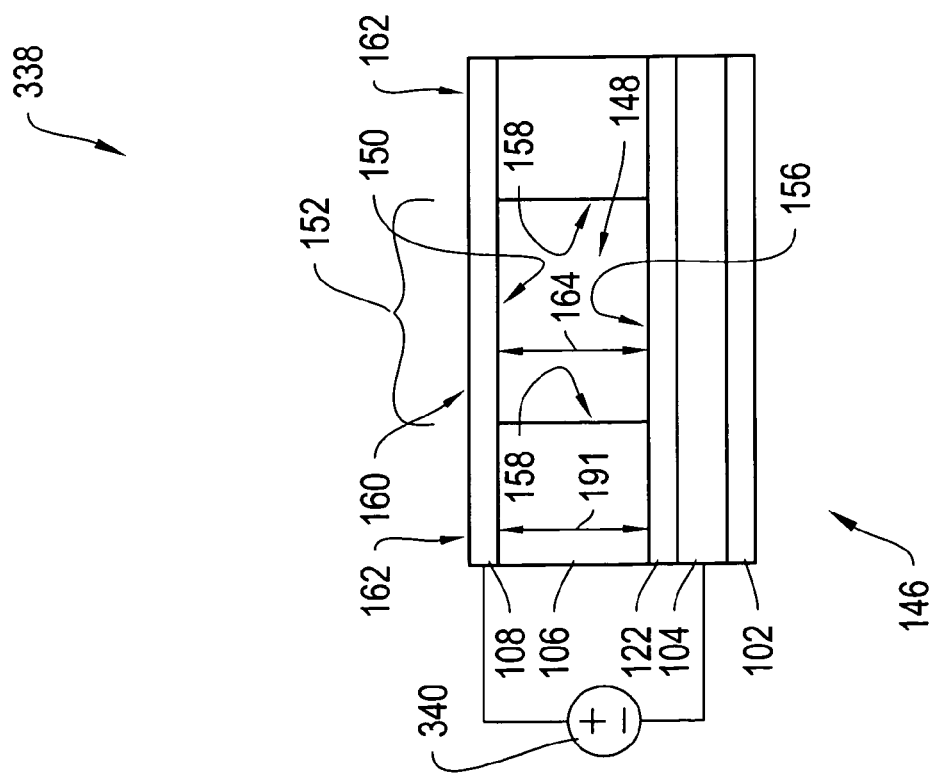

FIGS. 18A and 18B illustrate the operation of the machine 146 of FIG. 3B. As in the case of the illustrative embodiment of FIGS. 17A and 17B, the second conductor 108 is formed from a reflective material, such as aluminum, and the substrate 102, first conductor 104 and thin film 106 are all optically transmissive. Since the thin film 106 is removed and/or displaced under the actuatable region 128, the machine 146 also employs an electrical insulator 122, which as described above with regard to FIG. 3B, ensures that the first 104 and second 108 conductors do not short circuit with the actuatable region 128 in a fully deflected state.

The illustrative embodiment of FIGS. 18A and 18B operates substantially the same as the illustrative embodiment of FIGS. 17A and 17B. For example, with a zero bias applied across the first 104 and second 108 conductors (e.g., first and second electrodes), the actuatable region 152 remains undeflected. Additionally, in this state, both the inner 150 and outer 160 surfaces of the actuatable region 152 remain substantially flat, and reflect incident light with minimal scattering.

In response to the source 340 applying a sufficient bias voltage (e.g., about 1-10 V), an electric field forms between the first 104 and second 108 electrodes, causing the flexible actuatable region 152 to deflect toward the thin film 106. In response to a sufficient bias voltage, the actuatable region 152 deflects far enough to bottom out on the thin film 106, bringing the inner surface 150 of the actuatable region 152 of the conductor 108 into contact with the upper surface 156 of the thin film 106. In the fully deflected/actuated state of FIG. 18B, the reflective inner 160 and outer 150 surfaces of the actuatable region 152 continue to be flat enough to reflect incident light.

Varying the level of the control voltage 340 achieves varying degrees of deflection of the actuatable region 152 toward the thin film 108. According to another feature, in intermediate states of actuation, the actuatable region 152 stays substantially flat. According to various illustrative embodiments, in intermediate states of actuation, the substantially flat portion of the actuatable region 152 remains at least about 60%, 70%, 80%, or 90% of the size of the substantially flat portion of the actuatable region in the fully actuated state of FIG. 18B. As in the case of the machines 100 and 126, in response to the control voltage 340 being taken away, the actuatable region 152 is sufficiently resilient to return to its initial shape.

One significant difference between the illustrative machine of 146 and the machine 126, is that the machine 146 is formed without a raised thin film section 186. As described above with respect to FIGS. 14A-15B, this is accomplished by varying the characteristics of the laser 184, such as power, spot size, pulse width, distance from the bottom side 180 of the substrate 102, and exposure time. Without the raised section 186, the deflection range of the actuatable region 152 becomes the thickness 191 of the thin film (e.g., between about 50 nm and about 1 μm or greater). As also mentioned above with respect to FIGS. 14A-15B, one advantage of this configuration is that the machines of the invention formed in the structure 166 are substantially invisible when from the top surface 162 of the second conductor 108.

Figure 19C:
FIGS. 19A-19C are a series time delayed sequential images depicting operation of a actuatably movable machine of the type shown in FIG. 2A.
Figure 19B:
Figure 19A:

FIGS. 19A-19C show time elapsed images of a actuatably movable machine 342 of the type described above with respect to FIGS. 17A and 17B. The machine 342 has a diameter 344 of about 50 μm, and was formed on a structure 166 having a 200 nm thick CuPC thin film layer 106. The images were captured using a 100× microscope objective, with a DC bias applied between the first 104 and second 108 conductors and switched between 0Vdc and 10Vdc. The images of FIGS. 19A and 19C show the machine 342 in an unactuated state, while FIG. 19B shows the actuatable region 346 fully actuated against the thin film layer 106.

Figure 20A:
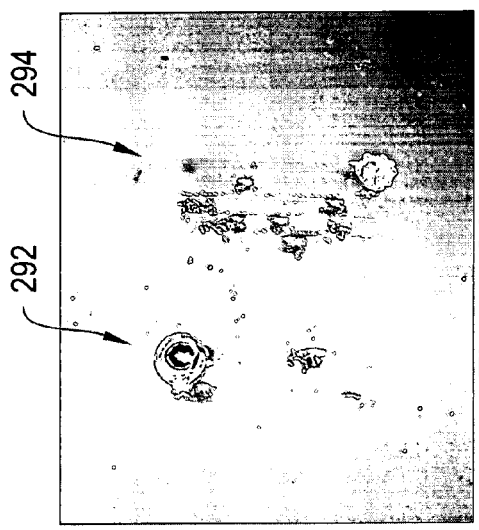
FIGS. 20A-20D are a series time delayed sequential images depicting operation of the actuatably movable machines shown in FIGS. 15A and 15B.
Figure 20B:
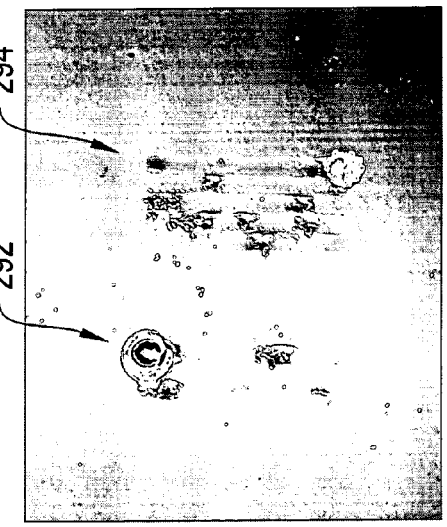
Figure 20C:
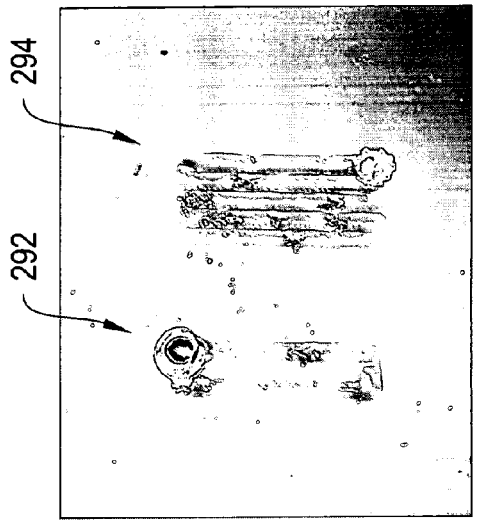
Figure 20D:
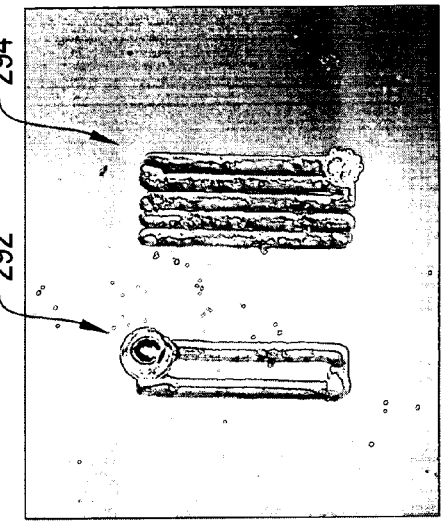

FIGS. 20A-20D show images of the actuatably movable machines 292 and 294 of FIGS. 15A and 15B actuated at four different voltage levels. More particularly, the image of FIG. 20 is an image of the top surface of the second conductor of the machines 292 and 294 with 0 Vdc bias applied between the first and second conductors. As can be seen, aside from the imperfections due, for example, to lock in issues with the laser of the test set up, the machines 292 and 294 are substantially invisible from this view. FIG. 20B is the same view with a 3 Vdc bias applied. FIGS. 20C and 20D show the same view with 5 Vdc and 8 Vdc, respectively, applied. As can be seen in FIG. 20D, 8 Vdc is sufficient to cause the actuatable region of both devices to bottom out.

Figure 21A:
FIGS. 21A and 21B are a images showing the actuatably movable machines shown in FIGS. 14C and 14D in un- and fully- actuated states.
Figure 21B:

FIGS. 21A and 21B show images of the actuatably movable machines 244 and 264 of FIGS. 14C and 14D actuated at 0 Vdc and 8 Vdc, respectively. As can be seen in FIG. 21A, aside from the imperfections due, for example, to lock in issues with the laser of the test set up, the machines 266 and 264 are substantially invisible with 0 Vdc applied between the first 104 and second 108 conductors. As can be seen in FIG. 21B, 8 Vdc is sufficient to cause the actuatable region of both devices to bottom out.

Figure 22:
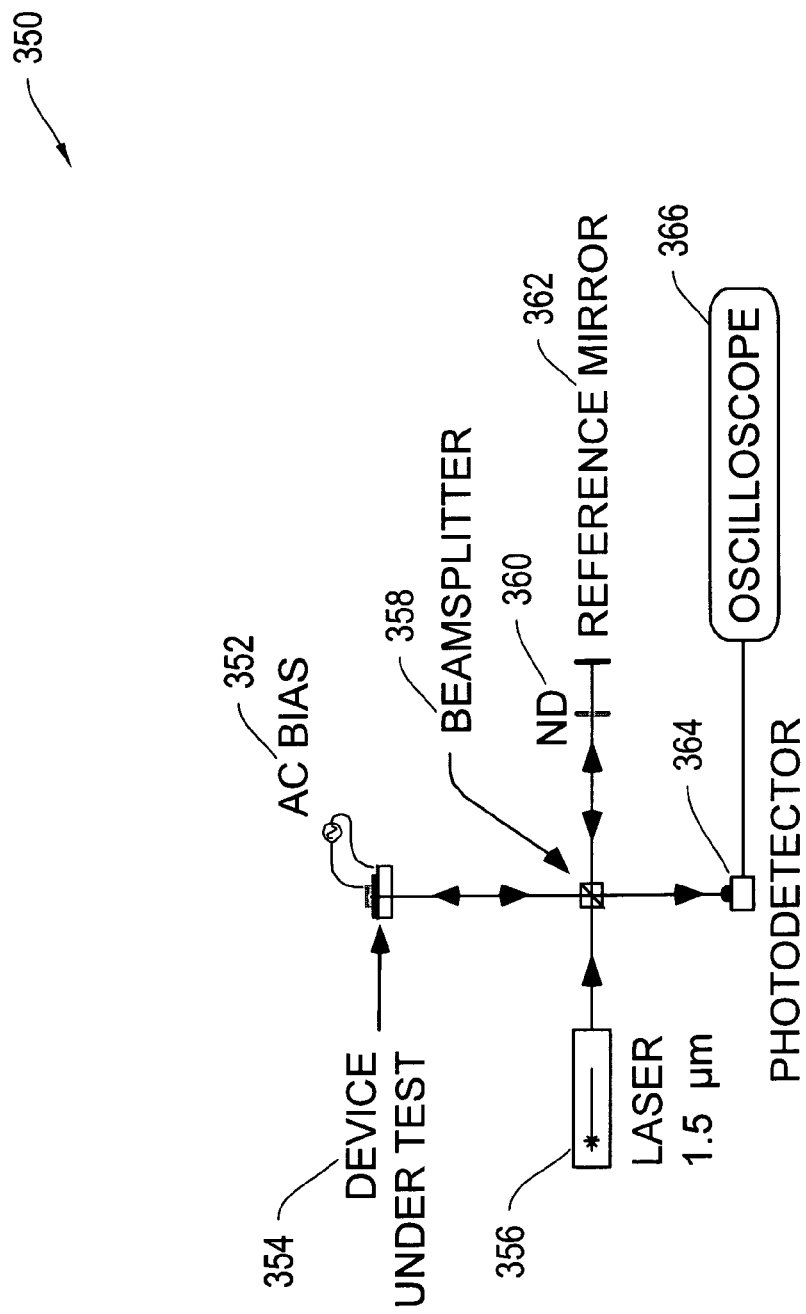
FIG. 22 is a conceptual diagram of a Michelson interferometer used to determine the amount of phase modulation provided by an actuatably movable machine of the invention.

FIG. 22 is a conceptual block diagram of a conventional Michelson interferometer 350 for testing phase modulation performance of a machine of the invention. In operation, an AC bias is applied across the first 104 and second 108 conductors of a machine 354 under test. At the same time a laser 356 is applied via a beam splitter 358 to either the inner or outer reflective surfaces of the actuatable region of machine 354. The laser 356 is also applied through an ND filter 360 to a reference mirror 362. Reflected light from the reference mirror 362 and reflected light from the machine under test 354 is interfered at the beam splitter 358 and passed to the photo detector 364. An electrical signal representative of the interference between the two reflected beams is displayed on the oscilloscope 366. The voltage level of the electrical signal from the photo detector 364 using known techniques can be corresponded to a measurement of phase modulation provided by the machine 354 under test. The machine 354 is of the type depicted in FIG. 2A.

Figure 23:
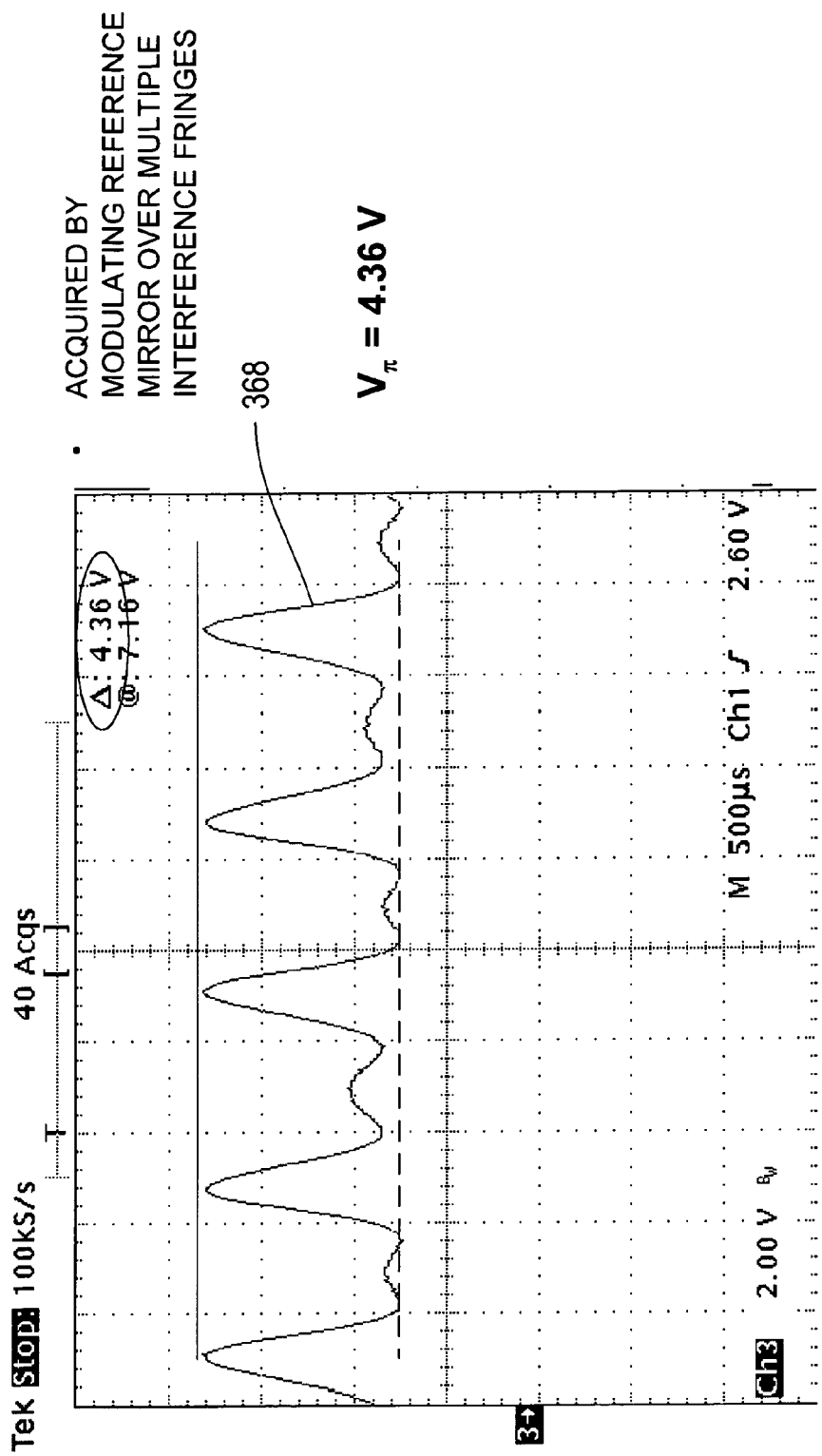
FIG. 23 is an oscilloscope trace of a voltage signal from the optical detector of the interferometer of FIG. 22, the voltage signal corresponding to a phase shift of π radians.
Figure 24:
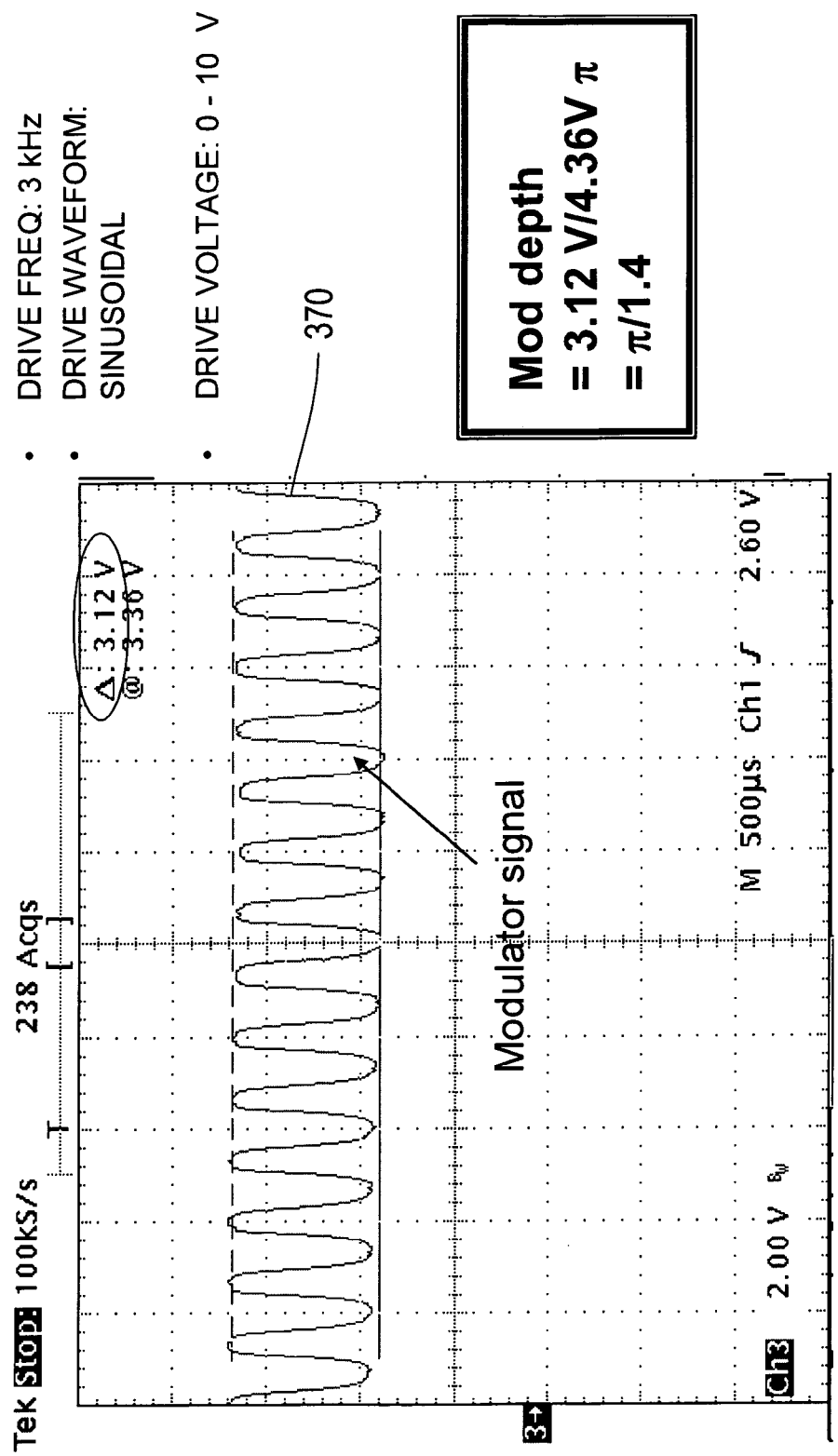
FIG. 24 is an oscilloscope trace of a voltage signal from the optical detector of the interferometer of FIG. 22, the voltage signal being indicative of an interference between an optical signal incident on the actuatable diaphragm of the actuatably movable machine of FIGS. 19A-19C driven by a 3 kHz, 0-10 V, sinusoidal wave and a reflected component of the incident wave.
Figure 25:
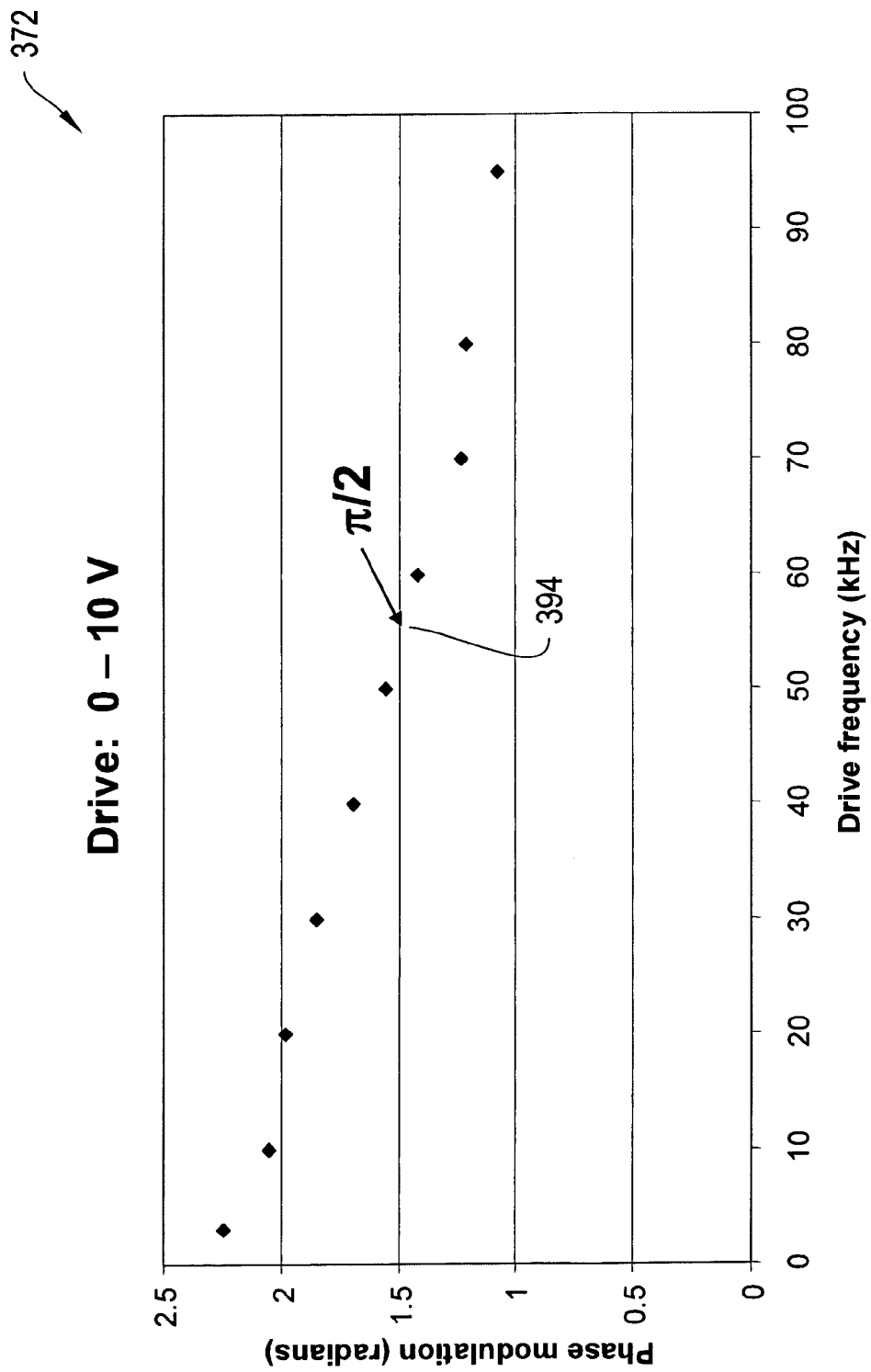
FIG. 25 shows the frequency response from 0 to 100 kHz for the actuatably movable machine of FIGS. 19A-19C.
Figure 26:
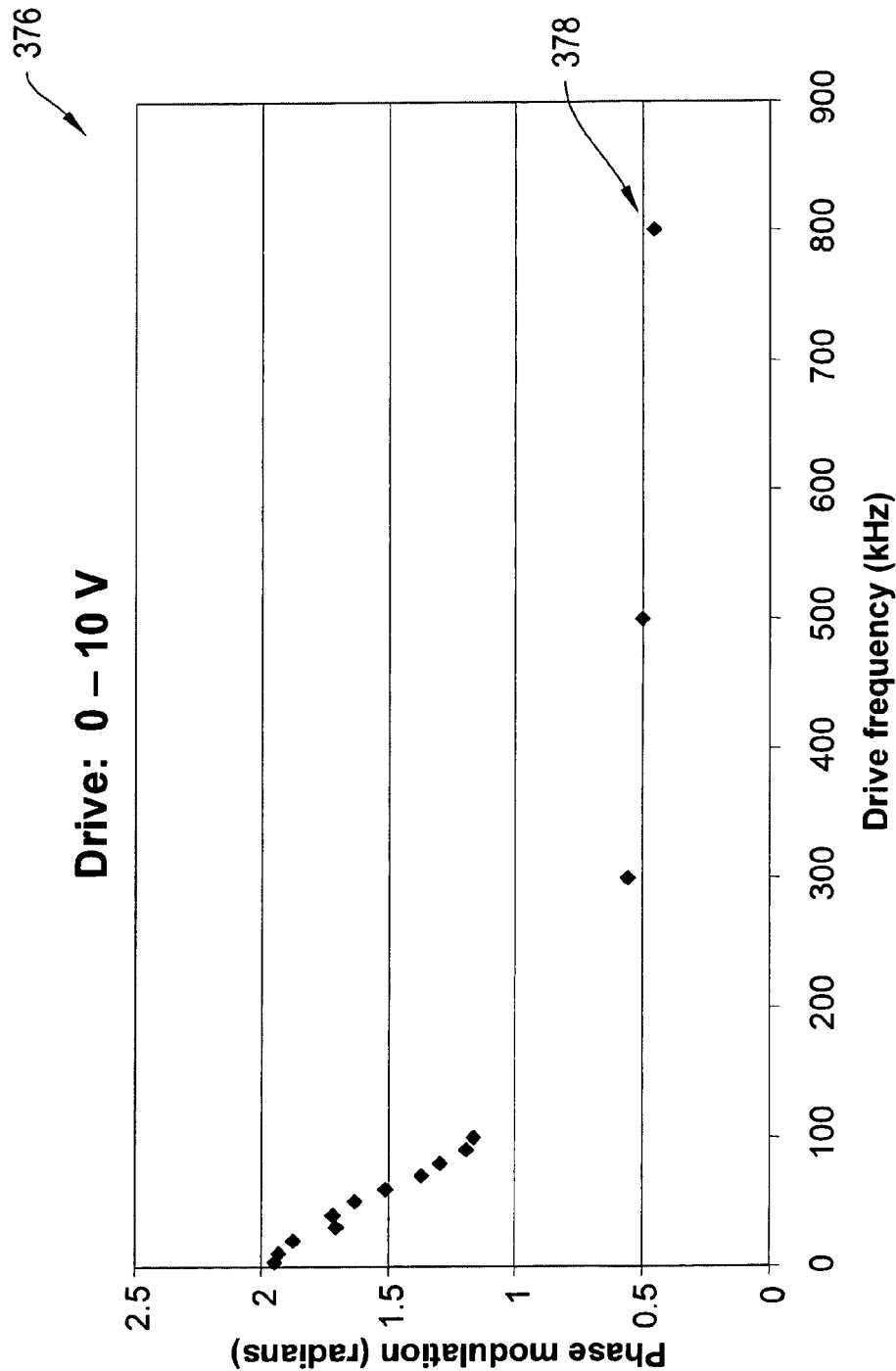
FIG. 26 shows the frequency response from 0 to 900 kHz for the actuatably movable machine of FIGS. 19A-19C.

FIG. 23 is a graph of a trace 368 from the oscilloscope 366 acquired by modulating the reference mirror 362 over a plurality of interference fringes to determine that $\pi$ radians of phase shift provides a 4.36 V peak-to-peak voltage trace 368. FIG. 24 is a graph of a trace 370 from the oscilloscope 366 obtained by applying an 3 kHz, 0-10 V, sinusoidal AC bias 352 across the first and second conductors of the machine under test 354. As shown, driving the machine 354 with the bias 352 provides an interference trace 370 of 3.12 V peak-to-peak. The phase modulation provided by the machine 354 can be determined by dividing the peak-to-peak voltage of the trace 370 by the peak-to-peak voltage of the trace 368, which yields a phase shift of $\pi/1.4$ radians (also referred to as the modulation depth). Using the formula, $$\text{Phase Modulation Depth} = 2\pi n 2\Delta L/\lambda$$

Where n is the refractive index of the medium through which the light travels, $2\Delta L$ is twice the displacement of the mirror of the machine 354 (i.e., the actuatable region of the second conductor 108), and $\lambda$ is the wave length of the of the AC bias 352. For $\lambda=1550$ nm light, the deflection $\Delta L$ of the deflection of the actuatable region can be determined to be about 277 nm for the machine 354. FIG. 25 depicts a graph 372 showing phase modulation versus frequency of the applied AC bias 352 for the machine 354. As shown at 374, at about 55 kHz, the machine 354 can still provide about $\pi/2$ radians of phase modulation. FIG. 25 is an expanded view 376 of the frequency response graph 372 of FIG. 24. As shown at 378, the machine 354 still provides about 0.5 radians of phase modulation at about 800 MHz.

Having now discussed illustrative embodiments relating to the structure, methods of manufacturing, and methods of operating the actuatably movable machines of the invention, we now turn to illustrative applications of the machines of the invention.

According to one application, the above described actuatably movable machines of the invention may be used as an optical phase modulator as described with respect to FIGS. 22-26. In one particular configuration, the frequency of the AC control voltage may be operator adjustable to provide phase modulation of a reflected component of an optical signal incident on either the inner or outer surfaces of the actuatable region. In a further configuration, the operator adjustable phase modulator may be provided as a compact unit for laboratory use.

Figure 27:
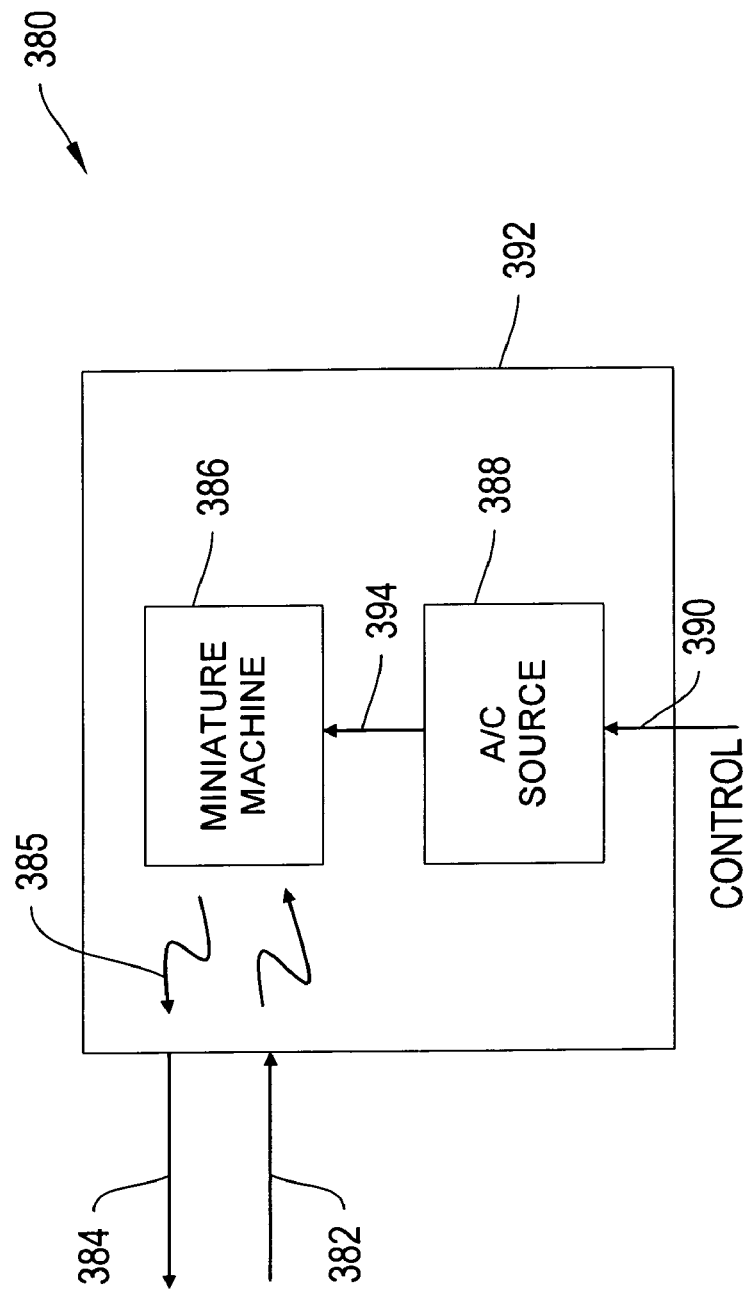
FIG. 27 is conceptual diagram of a compact, portable optical phase modulator suitable for laboratory use and employing a actuatably movable machine of the invention.

FIG. 27 is a conceptual block diagram of a compact optical phase modulation system 380 according to an illustrative embodiment of the invention. As shown, the illustrative system 380 includes an optical fiber input interface 382, an optical fiber output interface 384, an actuatably movable machine 386 of the type described above, an optical interface 385 between the machine 386 and the input 382 and output 384 optical fibers, an AC voltage source 388, and an operator control interface 390, all contained within or mounted to a portable, compact housing 392. In operation, the AC source 388 provides an AC drive signal 394 across the first and second conductors of the machine 386 to deflect that actuatable region. A fiber optic input interface 382 enables an operator to input an optical signal to be modulated into the housing 392. The optical interface 385 directs the input signal from the interface 382 to be incident on the actuatable region of the machine 388. The actuatable region of the machine 386 modulates a reflected component of the optical signal and directs it to the output interface 384 via the optical interface 385. The operator can read the modulated signal out of the system 380, for example, via an optical cable attached to the interface 384. The operator control 390 enables the operator to select the frequency of the AC drive signal 394 and thus the frequency of the modulation. According to the illustrative embodiment, the machine 386 provides at least about a $\pi/2$ phase shift at a drive frequency of at least about 1 kHz, 10 kHz, 50 kHz, 100 kHz, 250 kHz, 500 kHz, 1 MHz, 10 MHz, or 100 MHz.

Figure 28:
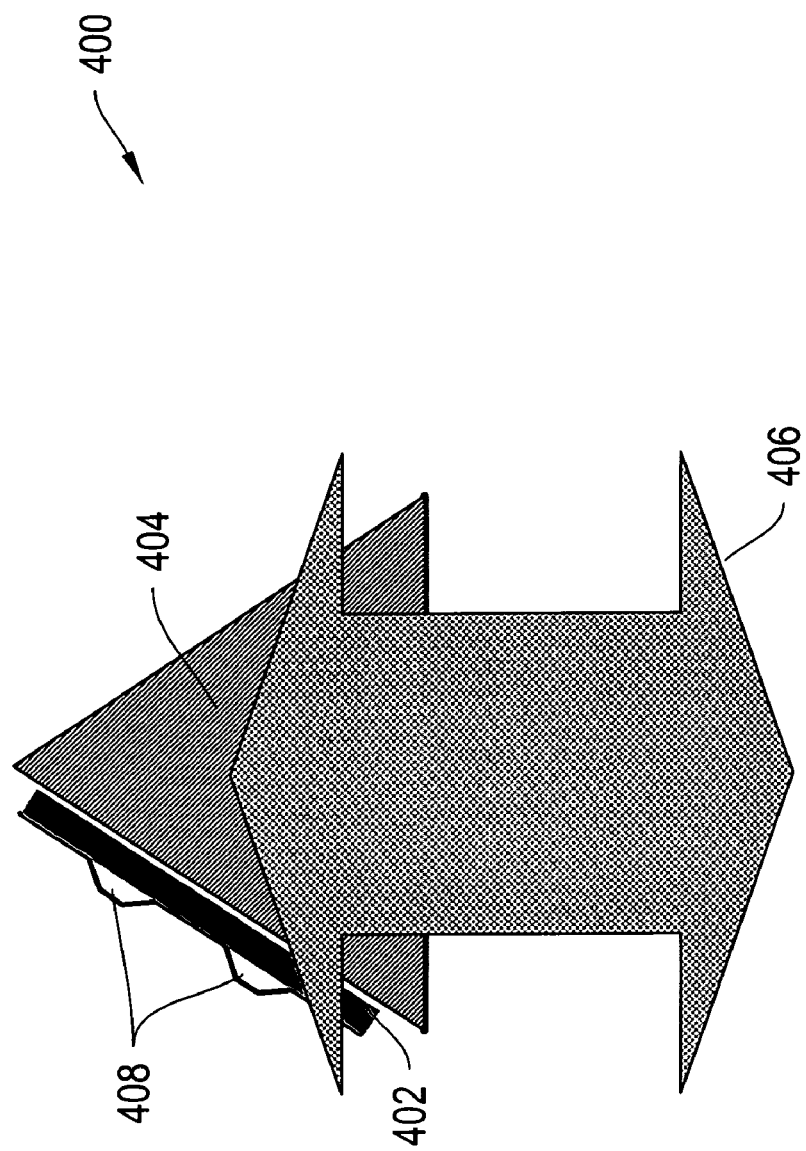
FIG. 28 is a conceptual diagram of an optical corner block retroreflector employing a actuatably movable machine of the invention to modulate information onto an optical signal.

According to another illustrative application, an AC drive voltage across the first and second conductors may be varied to modulate information onto a reflected component of an optical signal incident on the actuatable region of machine of the invention. FIG. 28 is a conceptual diagram 400 of such an embodiment, wherein one or more machines 402 of the invention are fabricated on a surface (e.g., a retroreflector facet) of an optical corner block retroreflector 404. In operation, a light beam 406 is directed into the corner block 404. Inside the corner-block 404, the light enters the machine 402 and is incident on an inner surface of one or more actuatable regions 408. The communication signal to be modulated onto the light beam 406 can be used to drive or otherwise control the driving of the first and second conductor. According to one implementation, the information is phase modulated onto the reflected component of the light beam 406 by controlling the movement of the actuatable region of a machine having a substantially flat actuatable region, such as the illustrative embodiments of FIGS. 2A-3B. However, in other implementations, the information may be amplitude modulated onto the reflected component of the light beam 406 by switching a dome shaped actuatable region, such as that described with respect to the illustrative embodiments of FIGS. 1A and 1B between curved and flat states.

Figure 29A:
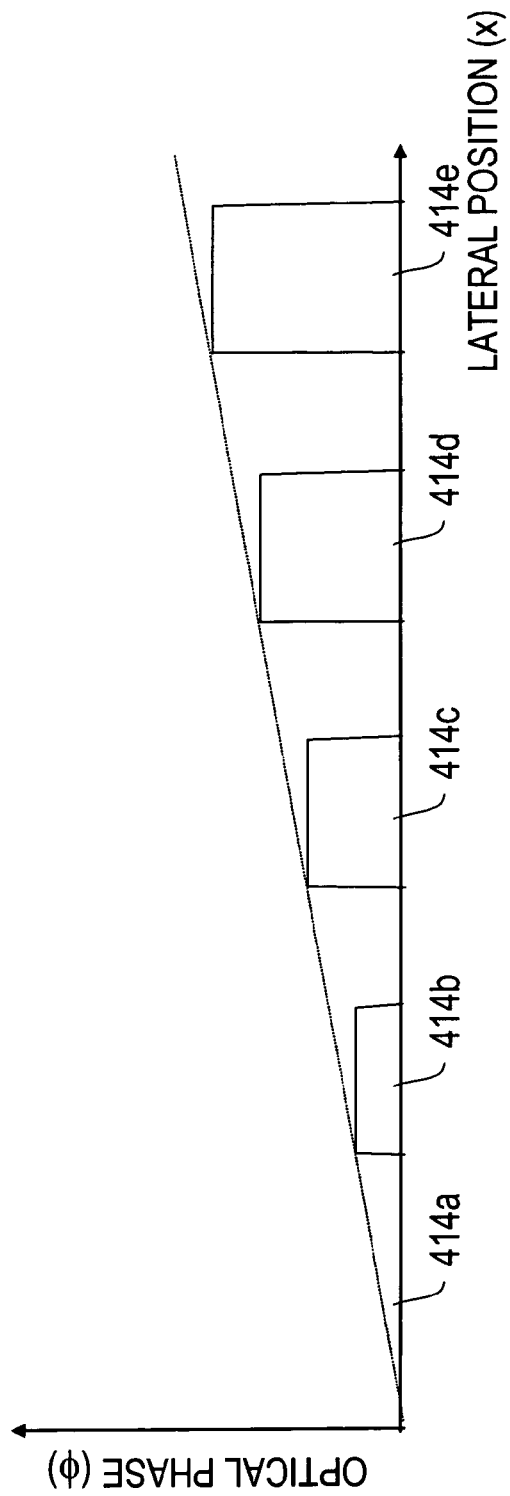
FIGS. 29A and 29B are conceptual diagrams illustrating a beam steering array employing actuatably movable machines of the invention.
Figure 29B:
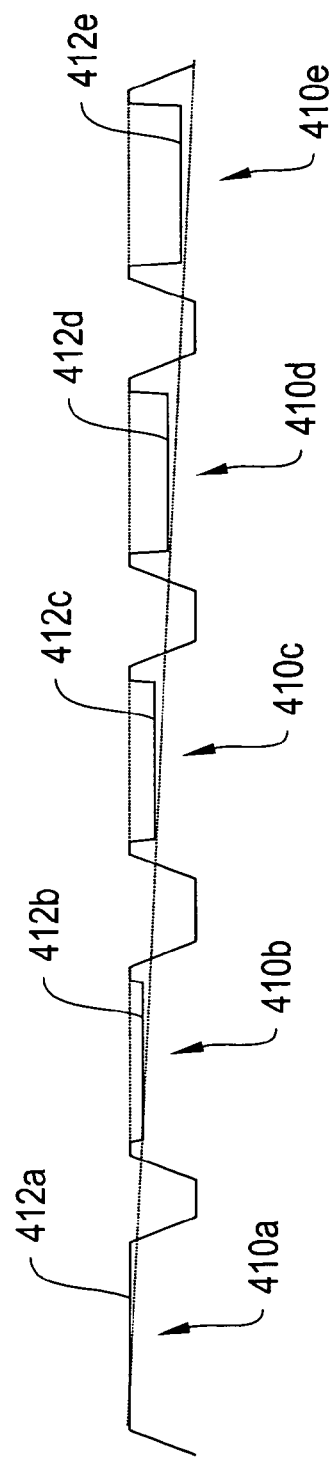

As mentioned above with regard to FIGS. 1-3B, in some illustrative embodiments, arrays of the machines of the invention may be employed to provide optical beam steering, for example, for imaging systems. FIGS. 29A and 29B conceptually depict one such array implementation. According to the illustrative embodiment of FIGS. 29A and 29B, differing DC and/or AC control voltages may be applied across the first and second electrodes of each machine 410a-410e in the array 410. FIG. 29B shows a conceptual side view of the deflected diaphragms 412a-412e of the respective machines 410a-410e. Interference of the light reflected off the individual diaphragms 412a-412e results in an overall steering of the reflected beam. The device, therefore, functions as an optical phased array. Any desired phase shift function may be achieved by applying the AC/DC control voltages in a corresponding pattern. In the particular embodiment of FIGS. 29A and 29B, the deformation pattern of FIG. 29B is applied to achieve the linear phase shift function depicted in FIG. 29A. FIG. 29A also shows the resulting phase shifts 414a-414e caused by the respective diaphragm deflections 412a-412.

Figure 30:
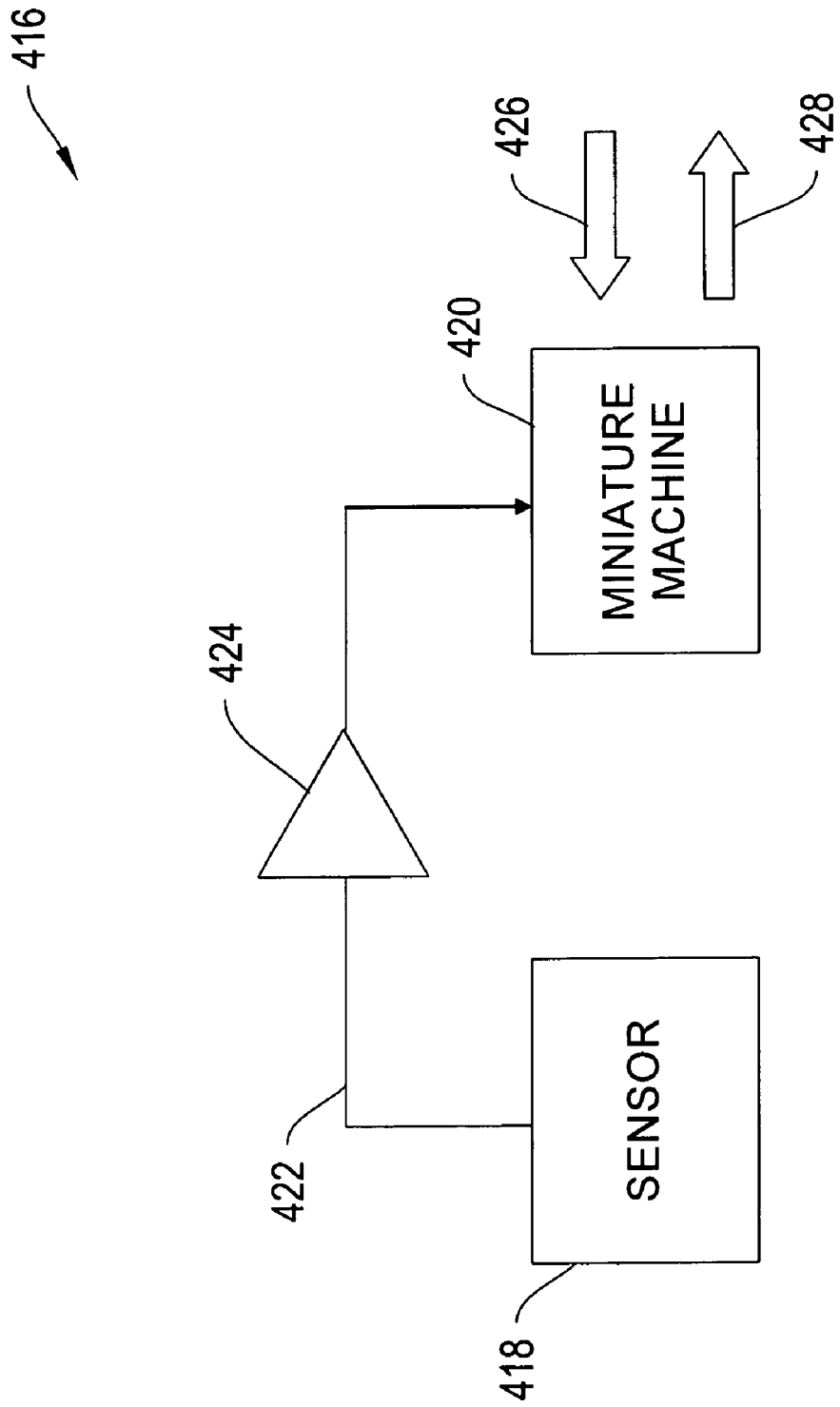
FIG. 30 is a conceptual block diagram of an optically interrogatable sensor employing a actuatably movable machine of the invention.

In an alternative implementation of the illustrative embodiment of FIGS. 29A and 29B, rather than applying individual control voltages to each of the machines 410a-410e to cause a different deflection, a voltage gradient may be applied across a common first conductor 104. Diaphragms located at the high potential end of the gradient deflect more than diaphragms at the low potential end of the gradient, with those in between deflecting in relation to their position along the gradient. In this embodiment, materials such as indium-tin-oxide (ITO), aluminum-doped zinc oxide, or other materials having reduced electrical conductivity may be used for the first conductor 104. FIG. 30 shows another illustrative application in which a machine of the invention is employed in an optically interrogatable sensor system 416. In one implementation, the system 416 includes a sensor 418 and a machines 420 such as any of those described herein. In operation, the sensor 418, which may be any type of sensor, generates an electrical signal 422 indicative of a parameter being sensed/measured by the sensor 418. A circuit 424 may amplify or otherwise buffer the electrical signal 422 and provide it across the first and second conductors of the machine 420 to control positioning of the actuatable region. A user wishing to interrogate the sensor 418 can direct an optical interrogation beam 426 at a reflective surface on either the interior or exterior sides of the actuatable region. Phase shift in the reflected component 426 can be corresponded to the value of the electrical signal 422 and thus the value of the sensed parameter.

Alternatively, if only a single digit binary output from the sensor 418 needs to be read, a machine of the type depicted in FIGS. 1A and 1B may be employed. In that case, a high signal from the sensor 418 can be used to deflect the dome shaped actuatable region to cause the interrogation beam 426 to be reflected. Whereas, a low signal from the sensor 418 causes no deflection of the dome shaped actuatable region, and the interrogation beam 426 is scattered rather than reflected.

As mentioned above with reference to FIGS. 1-3B, FIGS. 31A and 31B show another illustrative optical beam steering embodiment of the invention. According to the illustrative embodiment of FIGS. 31A and 31B, the machine 146 of the type depicted in FIG. 3B is employed as an individually addressable pixel 430. Although, the miniature machine 146 is shown in the illustrative embodiment, any of the illustrative machines of the invention, including both those with and without electrical insulator layers, may be used similarly. As described above, the machine 146 includes a substrate 102 a first conductor 104, an electrical insulator 122, an thin film 106 and a second conductor 108. In prior embodiments, a drive voltage is applied across the first 104 and second 108 conductors to deflect the actuatable region 152, for example, to phase modulate a reflected component 436b of an optical beam 436a incident on a reflective inner 150 or outer 160 surface of the actuatable region 152. However, in the illustrative embodiment of FIGS. 31A and 31B, the material of the first conductor is selected to have sufficiently reduced conductivity that a potential can be applied across it. Suitable materials include, without limitation, indium tin oxide and aluminum-doped zinc oxide. As shown, a control voltage 432 is applied across both first 104 and second 108 conductors. With zero volts applied, the actuatable region 152 remains undeflected and reflects light beam 436a incident on it at an angle corresponding to the angle of incidence. This state corresponds to an "on" pixel. Alternatively, as shown in FIG. 31B, with a control voltage 432, for example, of between about 1-10 Vdc applied across the first conductor 104, the potential difference imposed across the first conductor 104 causes the actuatable region 434 to deflect at an angle, which in turn causes the light beam 436a to be reflected 436a at an increased angle away from the source of the initial light beam 436a. This state corresponds to an "off" pixel. A tilted phase-front mirror can similarly be constructed using multiple elements disposed across the potential gradient in a similar fashion to that described above with respect to FIGS. 29A and 29B.

Figure 32:
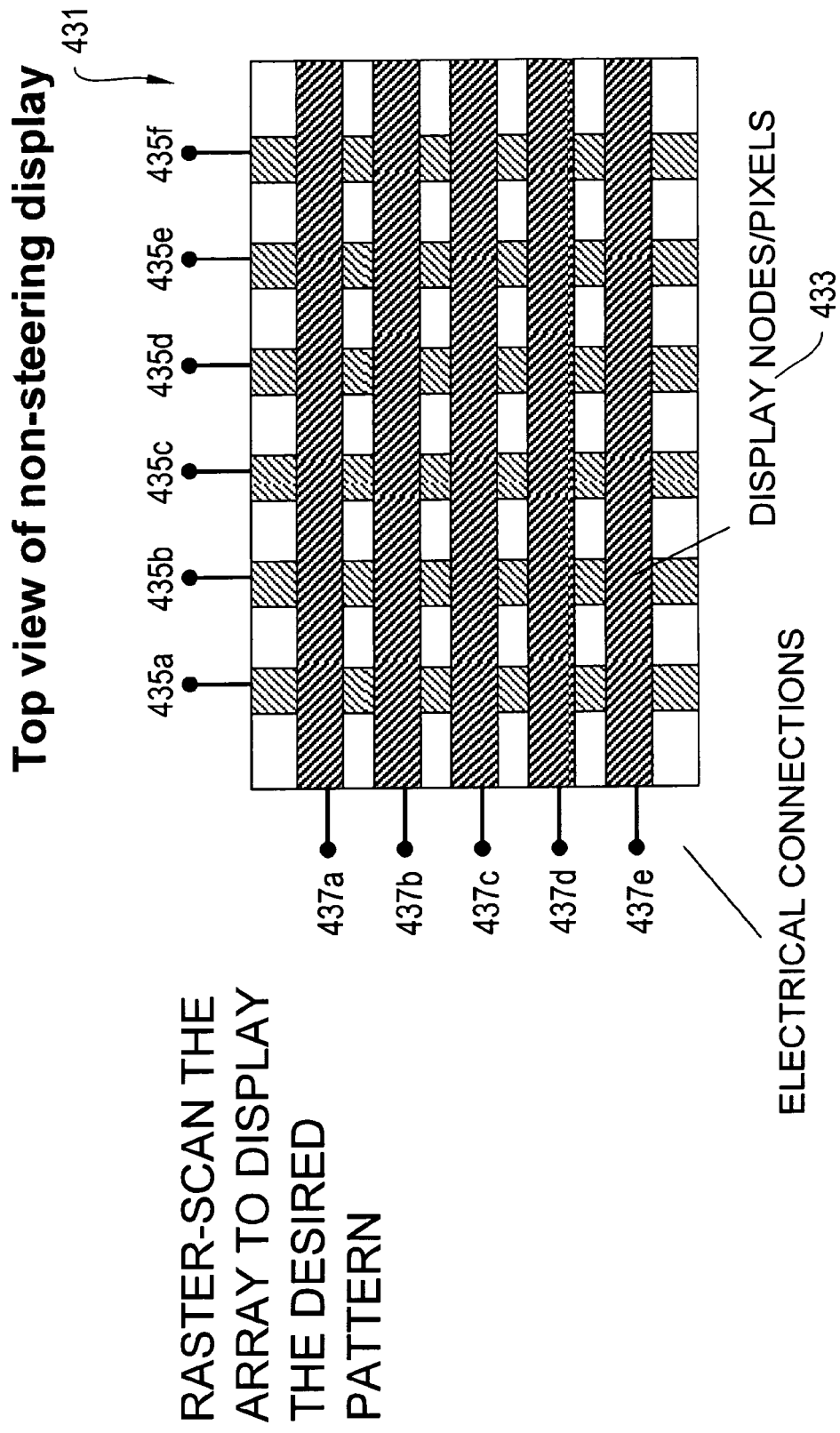
FIG. 32 is a conceptual diagram of a pixel addressable imaging array according to another illustrative embodiment of the invention.

FIG. 32 is a conceptual drawing of another imaging application of the invention. More particularly, FIG. 32 shows an illustrative non-steering display 431 employing an array actuatable machines of the type shown in FIG. 3B as individually addressable pixels 433. However, as in the case of the illustrative embodiment of FIGS. 31A and 31B, any suitable actuatable machines of the invention may be similarly employed. In operation, a control voltage (e.g., between about 1-10 Vdc is applied across a pair of first 435a-435f and second 437a-437f control terminals to deflect the actuatable region of a particular one of the pixels 433. Deflected and non-deflected states of the pixels 433 may be arbitrarily defined as either "on" or "off" pixels. The control voltage may be applied, for example, across the first 104 and second 108 conductors to cause a particular pixel 433 to deflect.

Figure 33:
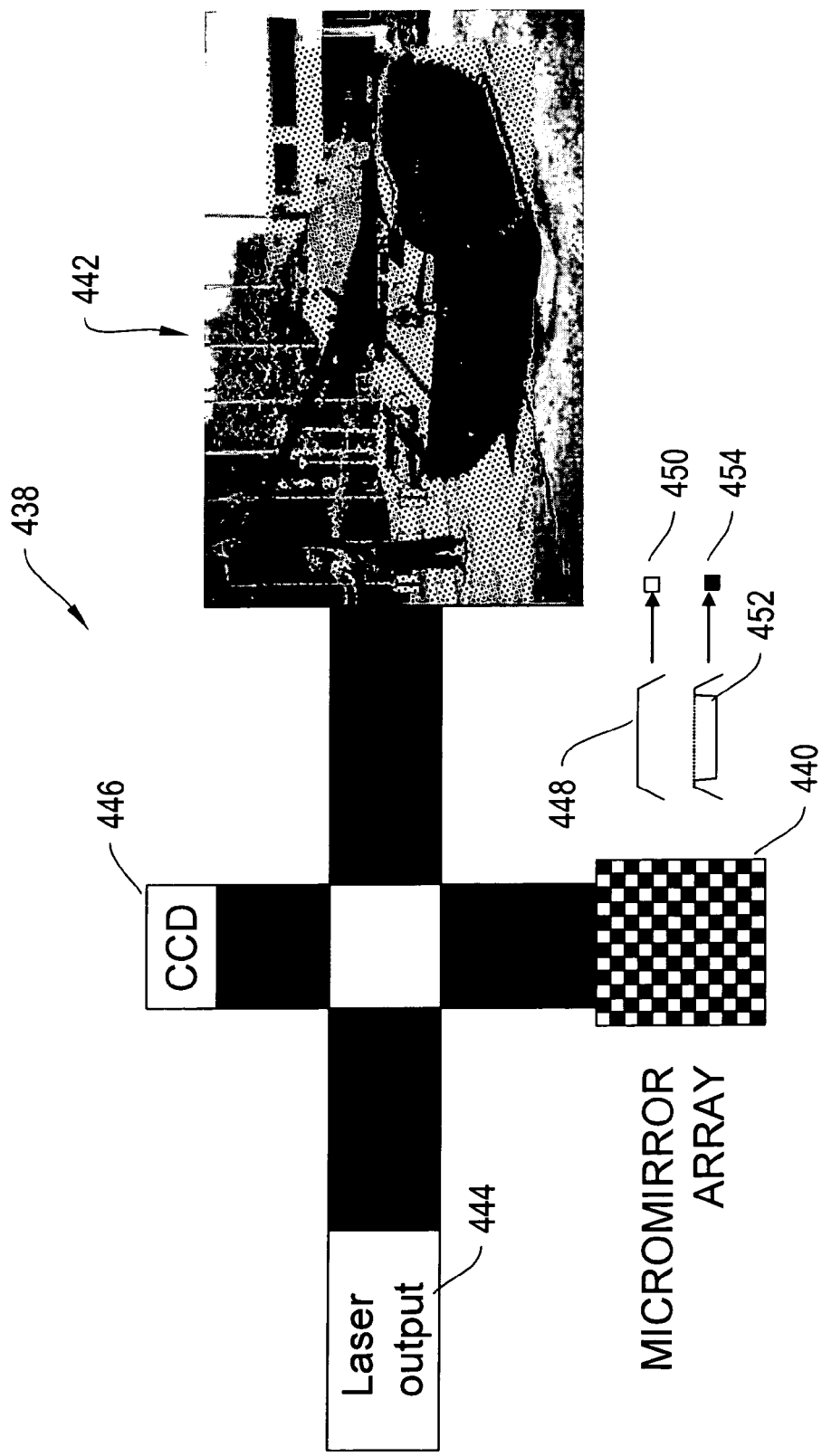
FIG. 33 is a conceptual diagram illustrating an object identification system employing an array of actuatably movable machines of the invention.
Figure 34:
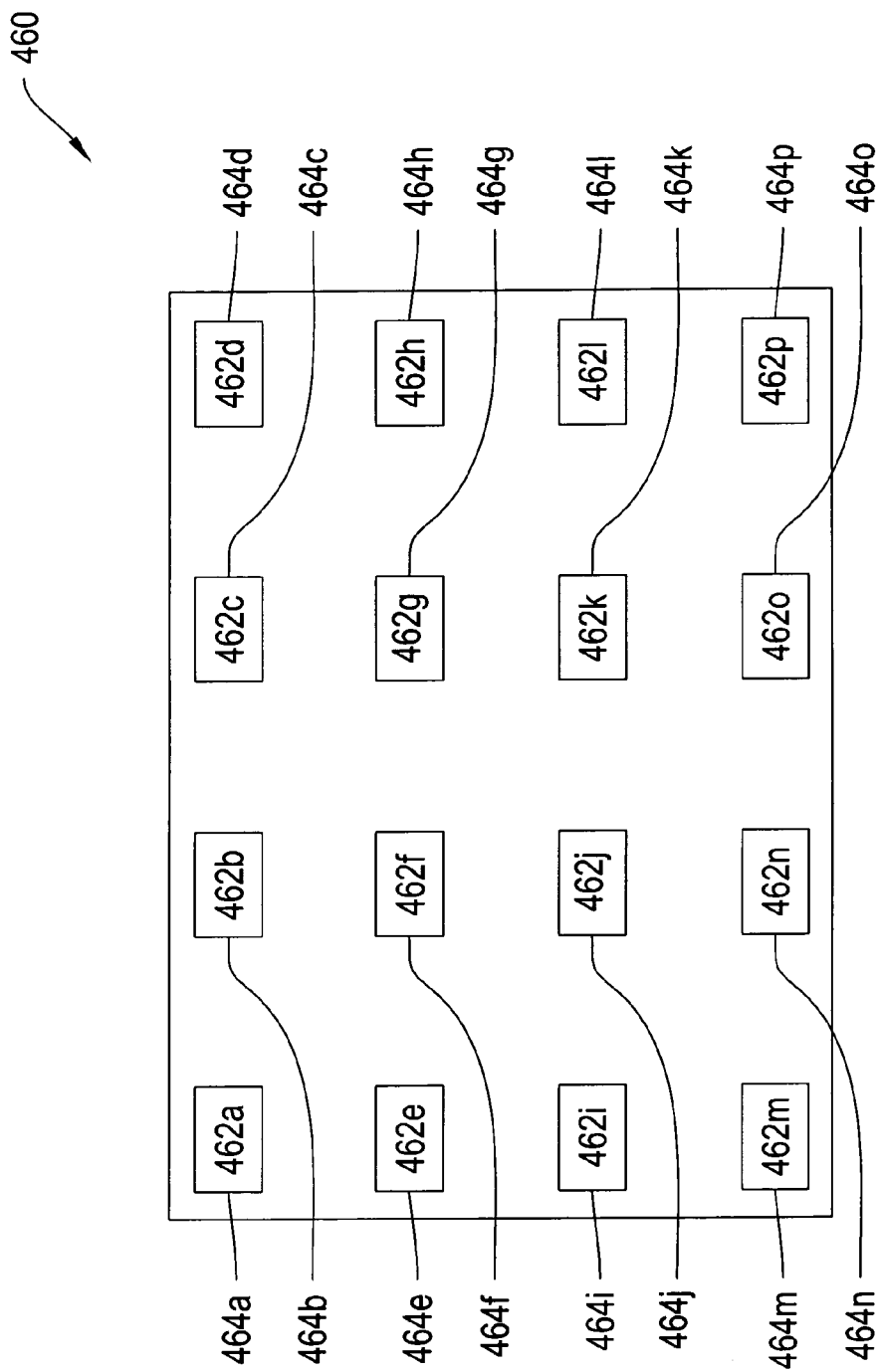
FIG. 34 depicts a system for selective delivery the contents of an enclosed chamber of any of an array of actuatably movable machines according to another illustrative embodiment of the invention.

According to another imaging application, an array of machines of the invention are used for an automatic target identification system. FIG. 33 is a conceptual diagram of an automated target identification system 438 employing a micromirror array 440 formed from an array of machines of the invention. According to the illustrative embodiment, optical phase information is collected from a target 442 using a laser source 444 according to conventional techniques. The optically collected phase information is then information is then compared to a template dynamically imposed on the micromirror array 440, where a first state 448 of a machine of the array 440 corresponds to an on pixel 450, and a second state 452 of a machine of the array 440 corresponds to an off pixel 454. The interference pattern between the dynamically imposed template and the optically collected phase information is imaged by the CCD 446 to establish target identity. According to a further feature, the system 438 may include a library of templates, with each template being cycled through the array 440 until the target is identified.

FIG. 334 shows another illustrative application in which each of the chambers of an array 460 of actuatably movable machines 462a-462p of the invention may be loaded with a substance, such as a biological or chemical agent. Loading may be, for example, through any suitable inlet port or may be absorbed into the thin film layer. In some embodiments, the agent may be released into the chamber upon laser ablation of the thin film layer. According to the illustrative embodiment, a sufficient control voltage 464a-464p may be applied to a respective machine 462a-462p to deflect the actuatable region sufficiently to break it and release the substance contained in the chamber.

Figure 35:
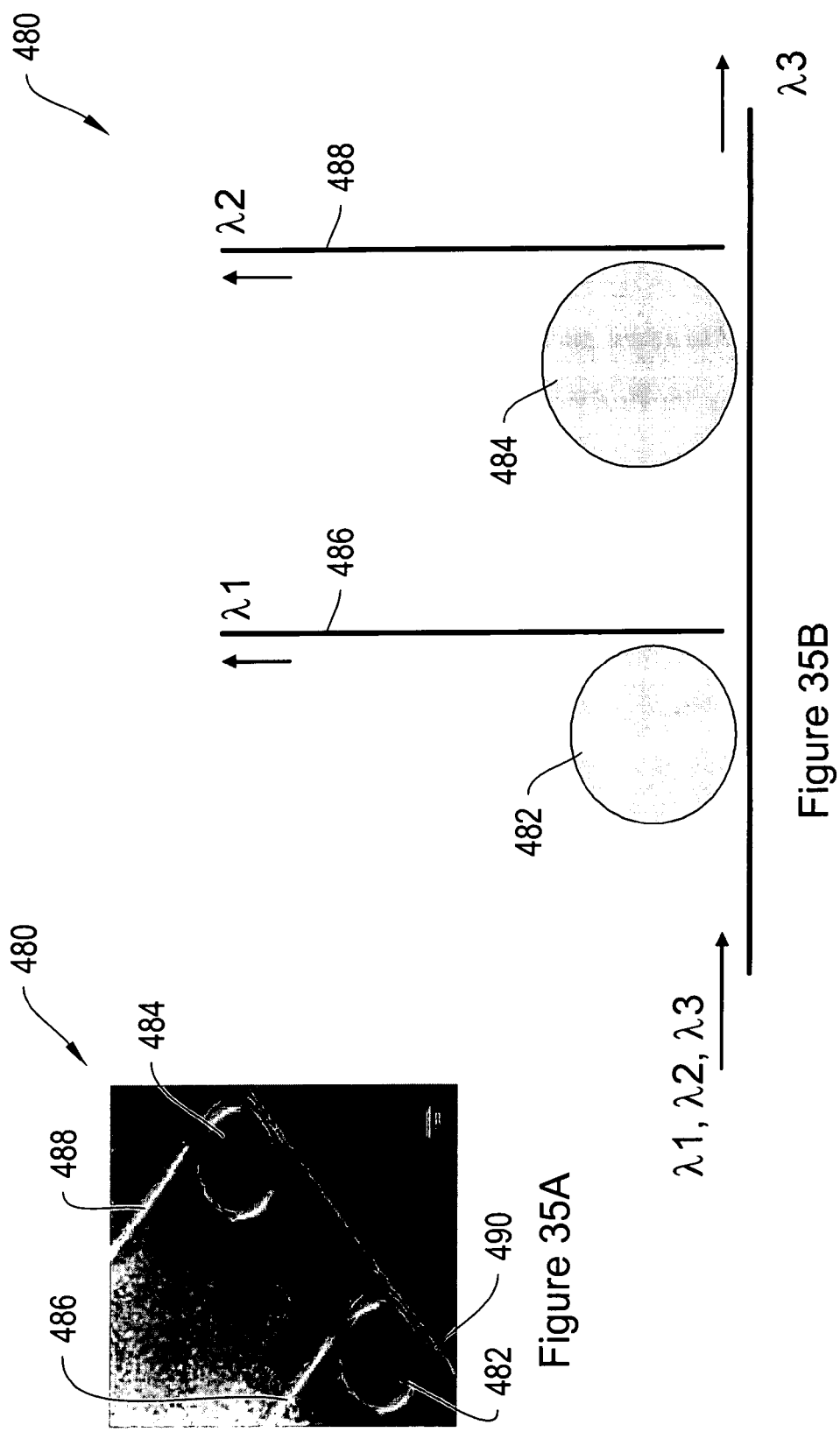
FIG. 35A depicts a passive wavelength division optical filter/channel router.
FIG. 35B is a conceptual diagram illustrating operation of the passive wavelength division optical filter/channel router of FIG. 35A.

In other illustrative embodiments, the machines of the invention may be employed in optical switching networks. By way of example, FIG. 35A depicts a passive wavelength division optical filter/channel router 480 employing first 482 and second 484 optical ring resonators fabricated using the direct laser writing approach of the invention. FIG. 35B is a conceptual diagram illustrating operation of the passive wavelength division optical filter/channel router 480 of FIG. 35A. Referring to both FIGS. 35A and 35B, the first ring 482 is resonant with the λ1 wavelength channel, which causes light having a wavelength of λ1 to be coupled into the ring resonator 482 and removed via the optical waveguide 486 from the throughput transmission on the waveguide 490. Similarly, the second ring 484 is resonant with the λ2 wavelength channel, which causes light having a wavelength of μ2 to e coupled into the ring resonator 484 and removed via the waveguide 488 from the throughput waveguide 490. Since this is passive, there is no control of when the wavelength channels λ1 and λ2 are to be dropped/removed from the throughput waveguide 490.

Figure 36:
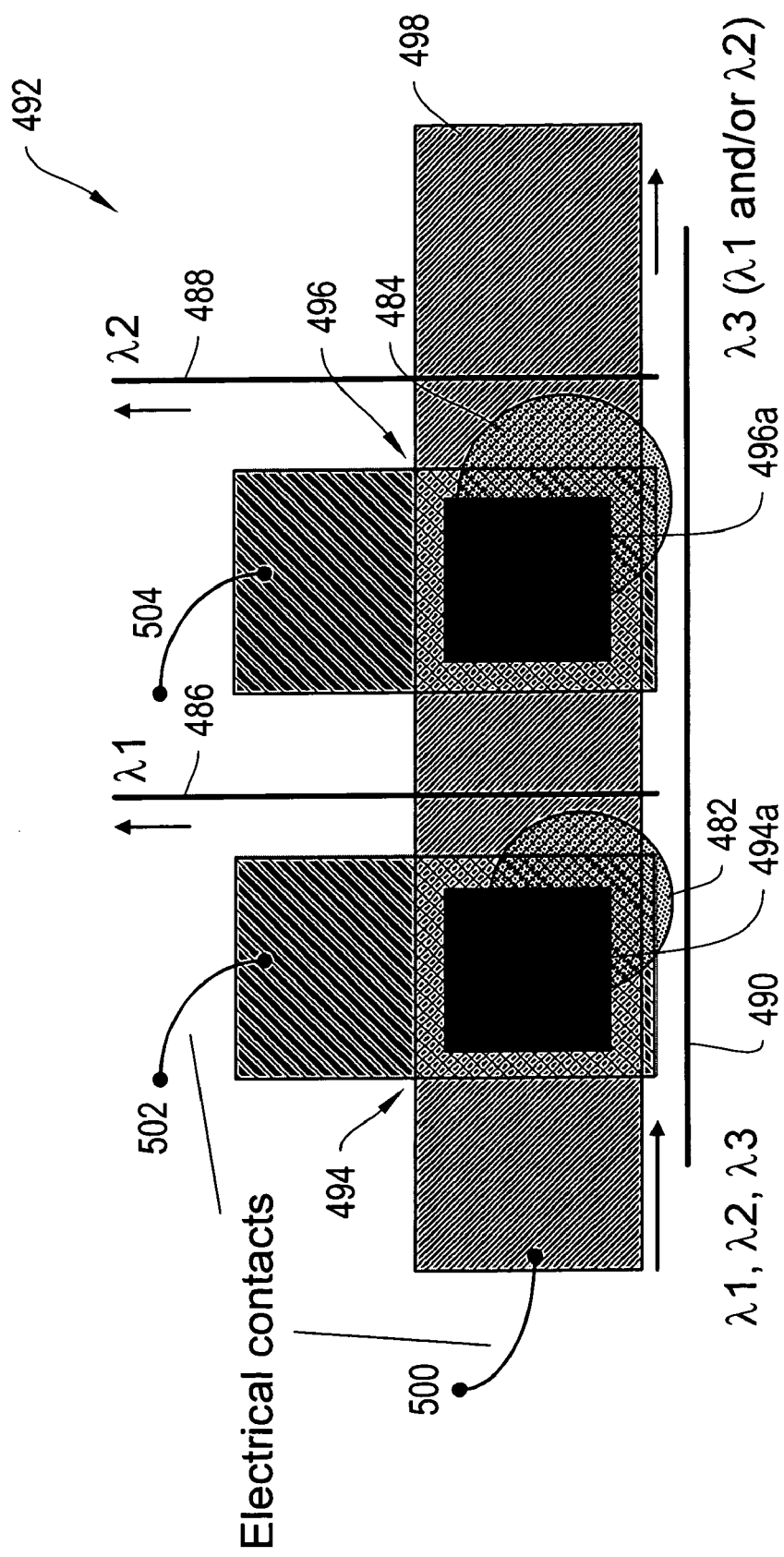
FIG. 36 is a conceptual diagram of an active wavelength division optical filter/channel router employing structures fabricated using the direct laser writing approach of the invention.

FIG. 36 conceptual diagram of an improved active wavelength division optical filter/channel router 492 employing structures fabricated using the direct laser writing approach of the invention. As in the filter/router 480 of FIGS. 35A and 35B, the filter/router 492 employs first 482 and second 484 ring resonators, along with the waveguides 486, 488 and 490. However, unlike the filter/router 480, the filter/router 492 includes first and second actuatably deflectable machines 494 and 496, which may be, without limitation, of the type depicted in FIGS. 2A-3B or disclosed elsewhere herein. More specifically, the machine 494 is formed such that its deflectable electrode 494a is precisely formed above at least a portion of the ring resonator 482 using the direct laser writing techniques of the invention. Similarly, the machine 496 is formed such that its deflectable electrode 496a is precisely formed above at least a portion of the ring resonator 484 using the direct laser writing techniques of the invention. The machines 494 and 496 may share a common stationary electrode 498 formed below the ring resonators 482 and 484, or in other embodiments, have separate electrodes. Electrical contacts 502 and 506 attach to the deflectable electrodes 494a and 496a, respectively, and the electrical contact 500 attaches to the common stationary electrode 498. The deflectable electrodes 494a and 496a may or may not have mirrored surfaces, depending on the particular application.

In operation, with neither machine 494 and 496 activated, λ1 passes out the waveguide 486, λ2 passes out the waveguide 488, and λ3 passes out the waveguide 490 in a similar fashion to the passive system of FIGS. 35A and 35B. However, in response to providing a control voltage across the electrodes 494a and 498, the electrode 494a deflects down toward the ring resonator 482, interacts with the optical field propagating within the ring resonator 482 and changes the Q of the resonator 482. This in turn causes the λ1 channel not to couple into the ring resonator 482, instead passing out the throughput waveguide 490. Thus, activating the machine 494, while keeping the machine 496 inactive, causes the waveguide 490 to pass λ1 and λ3. Similarly, activating the machine 496 alters the Q of the ring resonator 484 and causes λ2 not to couple into the resonator 496. Thus, activating the machine 496, while keeping the machine 494 inactive, causes the waveguide 490 to pass λ2 and λ3. As can be seen, deflecting both electrodes 494a and 496a destroys the Q of both ring resonators 482 and 484, and causes all three wavelengths λ1, λ2 and λ3 to pass through the waveguide 490. In this way control of a network of multiplexed wavelength channels can be accomplished with an array of individually addressable actuatably deflectable machines of the invention.

The machines of the invention may be employed in a variety of other applications. For example, elongated structures of the type shown in FIGS. 14A-15B may be employed as microconduits for microfluidic applications. In such embodiments, while the conduits may be laser direct written into structures by the methods described herein, the conduits need not include electrically conductive materials nor actuatable regions. However, in other illustrative embodiments, the actuatable regions may be controllably deflected to act as a microfluidic pump. In some cases, the conduits themselves may have their actuatable regions deflected to create flow without a separate and distinct pump. Such deflection may be controlled to create a wave-like motion traveling from one end of the conduit to the other to create a pumping action.

According to other illustrative applications, in addition to measuring phase modulation of light reflected from a machine of the invention, amplitude modulation may also be measured. According to other illustrative embodiments, the phase and/or amplitude modulation of light transmitted through the miniature machine of the invention may also be measured due to a reduction in the thickness of and/or an increase in the porosity of the second electrode following laser processing All the above described machines, including both miniature and macro sized machines, of the invention have numerous advantages over prior art devices, including without limitation, that: they may be formed in any arbitrary geometry; they can be laser machined directly into a multilayer substrate, which also provides higher yields and lower manufacturing costs compared to other micro-electro-mechanical machines; they may be formed with enclosed chambers; they may be formed with relatively high fill factors; the ultrafast laser micromachining process is highly scalable; structure length may exceed 1 mm (e.g., being on the order of centimeters, decimeters, meters or larger, and being limited at the high end primarily by the required structural parameters of the machine being fabricated rather than by the processes of the invention), while structure width may be less than 1 μm and may also exceed 1 mm (e.g., being on the order of centimeters, decimeters, meters or larger, once again being limited on the high end primarily by required structural parameters of the machine being fabricated rather than by the processes of the invention; they have a wide range of applications; and they can be easily controlled.

Another common advantage of the above discussed illustrative machines is the single layer/single material configuration of the actuatable regions 110, 128, 152. For example, this structure enables the machines of the invention to be actuated numerous times without degradation due to multiple actuatable layers becoming delaminated or otherwise separated from each other. The single layer structure also makes the machines of the invention less affected by thermal changes, which might otherwise cause differing materials having differing coefficients of thermal expansion to separate from each other. The single layer structure of the invention also enables the materials of the actuatable region to be selected and sized such that the actuatable region remains resilient enough to return to an unactuated state, simply by reducing or removing the control voltage, without need for a counter balancing force.

While the invention has been articularly shown and described with reference to illustrative embodiments, it is to be understood that various changes in form and details may be made without departing from the spirit and scope of the invention as defined by the appended claims.

What is claimed is:

1. A method of forming at least one actuatably movable machine, the method comprising,
   providing a substrate,
   providing a first conductive layer disposed on the substrate,
   providing an organic thin film layer disposed on the first conductive layer,
   providing a second conductive layer disposed on the organic thin film layer, and
   flowing current through the organic thin film layer to create at least one enclosed chamber in the organic thin film layer to form at least one actuatably movable machine, the at least one enclosed chamber being bounded along a first section of a periphery directly by an actuatable region of the first conductor and along a second section of the periphery by the organic thin film layer.

2. The method of claim 1, wherein the at least one actuatably movable machine is a plurality of actuatably movable machines, each having an enclosed chamber bounded along a respective first section of a periphery directly by a respective actuatable region of the first conductor.

3. The method of claim 1, wherein the at least one actuatably movable machine includes a plurality of actuatably movable machines, and performing the heating includes exposing a bottom side of the substrate to a plurality of laser light spots at locations aligned with respective locations at which each of the plurality of actuatably movable machines are to be formed on the second conductor.

4. A method of forming at least one actuatably movable machine, the method comprising,
providing a substrate,
providing a first conductive layer disposed on the substrate,
providing an organic thin film layer disposed on the first conductive layer,
providing a second conductive layer disposed on the organic thin film layer, and
heating the organic thin film layer to create at least one enclosed chamber in the organic thin film layer to form at least one actuatably movable machine, the at least one enclosed chamber being bounded along a first section of a periphery directly by an actuatable region of the first conductor and along a second section of the periphery by the organic thin film layer.

5. The method of claim 4, wherein the at least one actuatably movable machine is a plurality of actuatably movable machines, each having an enclosed chamber bounded along a respective first section of a periphery directly by a respective actuatable region of the first conductor.

6. The method of claim 4 comprising, performing the heating by placing the substrate, the first conductive layer disposed on the substrate, the organic thin film layer disposed on the first conductive layer, and the second conductive layer disposed on the organic thin film layer into an environment having a temperature of at least about 50° C.

7. The method of claim 6 comprising,
providing an electrical insulator between the organic thin film and the first conductor, and
placing the electrical insulator into the environment with the substrate, first conductive layer, organic thin film and second conductive layer.

8. The method of claim 4 comprising, performing the heating by exposing a bottom side of the substrate to at least one laser light spot at a location aligned with a location on the second conductor at which the at least one actuatably movable machine is to be formed.

9. The method of claim 8, wherein the spot has a diameter of between about 1 micrometers and about 500 micrometers.

10. A method of forming at least one actuatably movable machine, the method comprising,
providing a substrate,
providing a first conductive layer disposed on the substrate,
providing an organic thin film layer disposed on the first conductive layer,
providing a second conductive layer disposed on the organic thin film layer, and
applying a focused laser to the organic thin film layer through the substrate and the first conductive layer to create at least one enclosed chamber in the organic thin film layer to form at least one actuatably movable machine, the at least one enclosed chamber being bounded along a first section of a periphery directly by an actuatable region of the first conductor and along a second section of the periphery by the organic thin film layer.

11. The method of claim 10, wherein the focused laser is a pulsed laser.

12. The method of claim 10, wherein the focused laser is focused to a spot and the spot has a diameter about equal to a diameter of the enclosed chamber.

13. The method of claim 10, wherein the spot has a diameter of between about 1 micrometer and about 500 micrometers.

14. The method of claim 10, wherein the at least one enclosed chamber includes a plurality of enclosed chambers, the at least one actuatably movable machine includes a plurality of actuatably movable machines, and the method comprises applying a plurality of focused laser spots to the organic thin film layer through the substrate and the first conductive layer to create the plurality of enclosed chambers, each of the plurality of actuatably movable machines including at least one of the enclosed chambers.

* * * * *